United States Patent
Torai et al.

(10) Patent No.: US 10,126,369 B2
(45) Date of Patent: Nov. 13, 2018

(54) SECONDARY BATTERY CAPACITY MEASUREMENT SYSTEM AND SECONDARY BATTERY CAPACITY MEASUREMENT METHOD

(71) Applicant: YOKOGAWA ELECTRIC CORPORATION, Tokyo (JP)

(72) Inventors: Soichiro Torai, Tokyo (JP); Masaru Nakagomi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 460 days.

(21) Appl. No.: 14/829,743

(22) Filed: Aug. 19, 2015

(65) Prior Publication Data
US 2016/0061908 A1 Mar. 3, 2016

(30) Foreign Application Priority Data

Sep. 1, 2014 (JP) .................................. 2014-177268
May 21, 2015 (JP) .................................. 2015-103851

(51) Int. Cl.
*G06F 19/00* (2018.01)
*G01R 31/36* (2006.01)
(Continued)

(52) U.S. Cl.
CPC ..... *G01R 31/3662* (2013.01); *G01R 31/3606* (2013.01); *G01R 31/3624* (2013.01);
(Continued)

(58) Field of Classification Search
CPC .......... H01M 10/0525; G01R 31/3651; G01R 31/3679
(Continued)

(56) References Cited

U.S. PATENT DOCUMENTS

2014/0167773 A1 6/2014 Hamano et al.
2015/0097518 A1* 4/2015 Bishop .................. H02J 7/0003
320/107

FOREIGN PATENT DOCUMENTS

EP 2 053 414 A2 4/2009
JP 2009-071986 A 4/2009
(Continued)

OTHER PUBLICATIONS

Tsuyoshi Sasaki et al., "Memory effect in a lithium-ion battery", Nature Materials, Apr. 14, 2013, pp. 569-575, vol. 12.

*Primary Examiner* — Edward Raymond
(74) *Attorney, Agent, or Firm* — Sughrue Mion, PLLC

(57) ABSTRACT

A secondary battery capacity measurement system includes a data convertor, an SOC computer, and a maximum capacity computer. The data convertor determines a partial derivative characteristic curve of a capacity-to-voltage derivative over voltage, the partial derivative characteristic curve indicating a characteristic of a capacity-to-voltage derivative, from a set of historical data of time-sequentially-measured values of voltage and current. The SOC computer computes a difference between the partial derivative characteristic curve and a reference derivative curve indicating a reference characteristic of the capacity-to-voltage derivative, and fits the partial derivative characteristic curve to the reference derivative curve by reducing the difference to estimate an SOC. The maximum capacity computer estimates a maximum value of capacity, from the partial derivative characteristic curve and the reference derivative curve. The reference derivative curve is given by a complex of first and second characteristic derivative curves respectively derived from positive and negative electrode materials.

20 Claims, 22 Drawing Sheets

(51) Int. Cl.
*H01M 10/48* (2006.01)
*H01M 10/42* (2006.01)
(52) U.S. Cl.
CPC ...... *G01R 31/3648* (2013.01); *H01M 10/482* (2013.01); *H01M 2010/4271* (2013.01)
(58) Field of Classification Search
USPC .................................. 702/63, 64, 182–185
See application file for complete search history.

(56) References Cited

FOREIGN PATENT DOCUMENTS

| | | |
|---|---|---|
| JP | 2009-080093 A | 4/2009 |
| JP | 2010-217070 A | 9/2010 |
| JP | 2013-019709 A | 1/2013 |
| JP | 2014-002122 A | 1/2014 |
| JP | 2014-052186 A | 3/2014 |
| JP | 2014-119331 A | 6/2014 |

* cited by examiner

*FIG. 15*

| ORIGIN | Peak1 POSITIVE ELECTRODE | | Peak2 NEGATIVE ELECTRODE | | Peak3 NEGATIVE ELECTRODE | | Peak4 POSITIVE ELECTRODE | |
|---|---|---|---|---|---|---|---|---|
| PARAMETER | H | W | H | W | H | W | H | W |
| Day1 (Initial) | 1 | 1 | 1 | 1 | 1 | 1 | 1 | 1 |
| Day2 | 0.98 | 0.99 | 0.88 | 0.90 | 0.87 | 0.90 | 0.97 | 0.98 |
| Day3 | 0.96 | 0.97 | 0.82 | 0.84 | 0.81 | 0.83 | 0.95 | 0.97 |

SECONDARY BATTERY CAPACITY MEASUREMENT SYSTEM AND SECONDARY BATTERY CAPACITY MEASUREMENT METHOD

FIELD OF ART

The present invention is related to a secondary battery capacity measurement system and a secondary battery capacity measurement method that measure the SOC (state of charge) and the maximum capacity of a secondary battery.

RELATED ART

Secondary batteries that are repeatedly charged are used as running motor drive power supplies in hybrid vehicles and electrical vehicles and, from the standpoint of their usability in storing energy not dependent on fossil fuels, such as solar power generation and wind power generation, which place a relatively low burden on the environment, they have come into widespread use, in industry, public institutions, and ordinary households.

In general, these secondary batteries are constituted as battery modules by a series connection of a prescribed number of battery cells to obtain the desired output voltage, and a prescribed number of battery modules obtaining the prescribed output voltage are connected in parallel to constitute a battery pack, from which a prescribed current capacity (Ah) is obtained.

One indicator of the performance of a secondary battery is the maximum capacity of the battery. This maximum capacity can be defined as an electrical quantity (Ah) output during the time in which the open-circuit voltage of the battery is reduced from the maximum voltage within a range of use of battery to the minimum usable voltage.

With repeated charging and discharging, deactivation and side reactions of the active substance that contributes to electrical conductivity cause deterioration of characteristics and a gradual reduction of the maximum capacity. Active substances are the materials of the positive electrode and the negative electrode, for example, and in the case of an Li (lithium) ion battery, a carbon material is used for the negative electrode and a lithium transition metal oxide is used for the positive electrode.

Also, in a secondary battery, because there is a concentration of energy of the activated materials in regions close to the lower limit and upper limit of the SOC, which is the ratio of the remaining capacity of the battery with respect to the maximum capacity, the progression of deterioration is accelerated by over-charging and over-discharging.

For this reason, in a secondary battery, it is necessary to limit charging and discharging in regions near the maximum voltage and the minimum voltage. By operating within a prescribed SOC range, it is possible to suppress progressive deterioration, and to extend the life of the secondary battery in comparison with the case of performing over-charging and over-discharging. In this case, being within the prescribed SOC range generally means 50%±30% of maximum capacity, that is, within a range of approximately 20% to approximately 80%.

In order to operate within a prescribed SOC range, it is important to accurately grasp the SOC. The SOC can be determined by accumulating the charging and discharging currents with respect to the battery during charging and discharging thereof. However, when the SOC is determined using the charging/discharging current, in long-term operation of the battery, errors in A/D (analog/digital) conversion in the current sensor accumulate. To correct for those errors, it is necessary to perform an SOC calibration operation at some time. Also, because the SOC is defined as the proportion of residual capacity with respect to the maximum capacity, gaining an accurate grasp of the SOC makes it essential to accurately grasp the maximum capacity of a secondary battery when it is deteriorated.

Generally, this maximum capacity is obtained by first fully charging the secondary battery and then completely discharging the secondary battery with a minute (discharge) current, which is integrated over time.

For this reason, for example, in the case of a battery system for used in a stationary installation, the SOC range in the normal operating mode is temporarily left, and a long-term switch is made from the operating mode to an evaluation mode, in which the maximum capacity measurement is performed.

In this case, the longer the time required in the evaluation mode, the longer becomes the time the operation of the secondary battery is stopped, thereby leading to a drop in the operating efficiency of the secondary battery.

In the case of determining the maximum capacity of a secondary battery, therefore, it is necessary to estimate the maximum capacity of a deteriorated battery over a short time and with a low cost, without leaving the SOC range in the operating mode.

In Japanese Patent Application Publication No. 2009-71986, the OCV (open-circuit voltage) of a battery is measured directly and the maximum capacity of the secondary battery is estimated by the change in the accumulated current when charging over a specified OCV region (prescribed voltage range).

In Japanese Patent Application Publication No. 2014-119331, the load current dependency of the OCV is cancelled, and the SOC and the maximum capacity are estimated simultaneously by optimizing the dV/dSOC vs. SOC characteristic curve (the curve indicating the relationship between the result of taking the derivative of the voltage value V by the SOC and the SOC).

In Japanese Patent Application Publication No. 2014-2122, the maximum capacity at the actual measurement time is estimated from the correlation relationship between the actually measured capacity in the range of between 20% or greater and 70% or less of the SOC and the maximum capacity when deteriorated.

In Japanese Patent Application Publication No. 2010-217070, using the voltage drop over a prescribed SOC region as a characteristic quantity, the maximum capacity of the secondary battery is estimated from the correlation relationship between this characteristic quantity and the maximum capacity when deteriorated.

In Japanese Patent Application Publication No. 2013-19709, using the peak voltage value of the dQ/dV vs V characteristics as a characteristic quantity, the maximum capacity of the secondary battery is estimated from the correlation relationship between this characteristic quantity and the maximum capacity when deteriorated.

In Japanese Patent Application Publication No. 2014-52186, using the internal impedance of the secondary battery as a characteristic quantity, the maximum capacity of the secondary battery is estimated from the correlation relationship between this characteristic quantity and the maximum capacity when deteriorated.

However, in the secondary battery capacity measurement system of the above-described Japanese Patent Application Publication No. 2009-71986, in order to measure the OCV accurately, it is necessary to have the current held (stopped)

at 0 A for a certain amount of time. In a power storage system for use in a stationary installation, there might be a load on the secondary battery at all times, making it impossible to expect that the current will be 0 A for very long.

Also, because the absolute value of the OCV of the secondary battery is measured directly, in a secondary battery having characteristics with a small voltage variation with respect to the SOC, the change in the voltage is sluggish with respect to deterioration of the maximum capacity, and because the voltage does not change so much in response to the change in the maximum capacity, it is difficult to estimate the maximum capacity with high accuracy.

In the secondary battery capacity measurement system of Japanese Patent Application Publication No. 2014-119331, by focusing on the derivative characteristics in a region in which the current value is constant, the influence of the voltage drop that is dependent on the current value (I×R (I)) is cancelled. By optimizing the curve (derivative curve) of the dV/dSOC vs. SOC characteristics of the terminal-to-terminal voltage value V and SOC in the region in which the current value is constant the SOC and the maximum capacity of the secondary battery are estimated simultaneously. In this case, the dV/dSOC vs. SOC characteristics indicate the relationship of correspondence between dV/dSOC and the SOC. In the case of Japanese Patent Application Publication No. 2014-119331, however, that the dV/dSOC vs. SOC characteristics does not change due to deterioration of the secondary battery is an essential premise. For this reason, if the shape of the curve representing the dV/dSOC vs. SOC characteristics that is the reference changes, that is, if there is a time change in the relationship of correspondence between dV/dSOC and SOC, using the initial dV/dSOC vs. SOC characteristics of the battery is a cause of error in estimating the SOC and the maximum capacity of the secondary battery.

FIG. 23 shows the curve of the relationship of correspondence between dV/dSOC and the SOC. FIG. 23 shows one example of the deteriorated state of a secondary battery determined by experiment, in which the vertical axis represents dV/dSOC in the secondary battery and the horizontal axis represents the SOC (% display) in the secondary battery. The solid line represents the curve of the initial values of the secondary battery, and the dotted line represents the curve after deterioration of the secondary battery. As can be seen from FIG. 23, although the shapes of the initial value curve and the curve after deterioration are close, there are large differences of values at points of inflection and the like. For this reason, if the curve representing the relationship of correspondence between dV/dSOC and the SOC characteristics is used as a reference, an error occurs in estimating the maximum capacity, as has been noted already.

In the secondary battery capacity measurement system of Japanese Patent Application Publication No. 2014-2122, because the actual measured maximum capacity is estimated from the correlation relationship between the actually measured capacity and the maximum capacity after deterioration, a time reduction of approximately 50% is achieved. However, it is necessary to acquire beforehand, for example by experiment, the correlation relationship between the capacity over a prescribed region of the secondary battery and the maximum capacity when deteriorated. For this reason, when data is acquired by experiment, a long time is required to cause deterioration of the secondary battery, and the process from the time of acquiring experimental data to the time of acquiring the correlation relationship is long.

Also, the battery used is not the actual secondary battery to be measured, but rather a secondary battery of the same type, production variations mean that a reference corresponding to the battery being measured is not achieved, and errors occur in the estimation.

Each of the Japanese Patent Application Publication No. 2010-217070, No. 2013-19709, and No. 2014-52186 require that prior acquisition of the correlation relationship between the characteristic quantities to be measured and the maximum capacity when deteriorated. For this reason, similar to the case of Japanese Patent Application Publication No. 2014-2122, much time is required when data is taken by experiment and in causing the secondary battery to deteriorate, so that the time required for the process from acquisition of data by experiment until acquisition of the correlation relationship is long and the development cost increases. Also, because the battery used is not the actual secondary battery to be measured, but rather a secondary battery of the same type, production variations mean that a reference corresponding to the battery being measured is not achieved, and errors occur in the estimation. Additionally, in Japanese Patent Application Publication No. 2014-52186, because a device to measure impedance must be incorporated in the secondary battery, there is a further increase in cost.

SUMMARY

The embodiments of the present invention are to provide a secondary battery capacity measurement system and a secondary battery capacity measurement method that simply and in a short period of time estimate the SOC and the maximum capacity of a battery, without acquiring beforehand the correlation relationship between a characteristic quantity of the object under measurement and the maximum capacity when deteriorated, and without leaving the operating range of the SOC.

In some aspects, a secondary battery capacity measurement system may include, but is not limited to, a data convertor, an SOC computer, and a maximum capacity computer. The data convertor is configured to determine a partial derivative characteristic curve of a capacity-to-voltage derivative over voltage, the partial derivative characteristic curve indicating a characteristic of a capacity-to-voltage derivative, from a set of historical data of time-sequentially-measured values of voltage and current. The SOC computer is configured to compute a difference between the partial derivative characteristic curve and a reference derivative curve indicating a reference characteristic of the capacity-to-voltage derivative, and configured to fit the partial derivative characteristic curve to the reference derivative curve by reducing the difference to estimate an SOC. The maximum capacity computer is configured to estimate a maximum value of capacity, from the partial derivative characteristic curve and the reference derivative curve. The reference derivative curve is given by a complex of first and second characteristic derivative curves, the first characteristic derivative curve is derived from a positive material of a battery positive electrode, and the second characteristic derivative curve is derived from a negative material of a battery negative electrode.

In some cases, the reference derivative curve is given by a separating curve complex of the first and second characteristic derivative curves.

In some cases, the first and second characteristic derivative curves are approximated with first and second functions which include first and second characteristic parameters of phase transition of the positive material and the negative material, respectively; and the curves of the first and second functions are adjustable by the first and second characteristic parameters, respectively.

In some cases, each of the partial derivative characteristic curves and the reference derivative curve is a pair of first and second curves, wherein the first curve representing a first relationship of correspondence between the voltage V in the battery and a value dQ/dV obtained by differentiating the capacity Q by taking a change d/dV in the voltage as a differential operator, and wherein the second curve representing a second relationship of correspondence between the capacity Q in the battery and a value dV/dQ obtained by differentiating the voltage value V by taking a change d/dQ in the capacity as a differential operator.

In some cases, the secondary battery capacity measurement system may include, but is not limited to, a reference derivative curve reconstructor that, when the maximum capacity computer corrects the reference derivative curve, performs fitting between the partial derivative characteristic curve and the reference derivative curve and that corrects the reference derivative curve by adjusting the characteristic derivative curves derived from the positive electrode and the negative electrode so as to correspond the fitted shape of the partial derivative characteristic curve, wherein the maximum capacity computer estimates the maximum capacity using the corrected reference derivative curve.

In some cases, the SOC computer has an SOC computation ability determiner that determines whether or not the maximum value of the value dQ/dV in the partial derivative characteristic curve of the first relationship of correspondence is less than a first threshold set beforehand, and wherein, if the SOC computation ability determiner determines that the maximum value of the value dQ/dV in the partial derivative characteristic curve of the first relationship of correspondence is less than the first threshold set beforehand, the SOC computer estimates the SOC.

In some cases, if the returning SOC corresponding to a returning point of the immediately previous charging/discharging is included in the partial derivative characteristic curve, the SOC computation ability determiner determines whether or not the SOC threshold, based on the peak of the reference derivative curve because of the phase transition of the electrode material of the battery, is included in the partial derivative characteristic curve, and if the judgment is that the SOC threshold is included in the partial derivative characteristic curve, the SOC computer estimates the SOC.

In some cases, the SOC computation ability determiner determines whether or not difference between the maximum value and the minimum value of the value dV/dQ in the partial derivative characteristic curve of the second relationship of correspondence exceeds a second threshold set beforehand, and wherein, if the SOC computation ability determiner determines that the difference between the maximum value and the minimum value of the value dV/dQ in the partial derivative characteristic curve of the second relationship of correspondence exceeds the second threshold set beforehand, the SOC computer estimates the SOC.

In some cases, the maximum capacity computer has a maximum capacity computation ability determiner that determines whether or not the maximum value of the value dQ/dV in the partial derivative characteristic curve of the first relationship of correspondence exceeds the first threshold set beforehand, and wherein, if the maximum capacity computation ability determiner determines that the maximum value of the value dQ/dV in the partial derivative characteristic curve of the first relationship of correspondence exceeds the first threshold set beforehand, the maximum capacity computer estimates the maximum capacity.

In some cases, if the returning SOC corresponding to a returning point of the immediately previous charging/discharging is included in the partial derivative characteristic curve, the maximum capacity computation ability determiner determines whether or not the SOC threshold, based on the peak of the reference derivative curve because of the phase transition of the electrode material of the battery, is included in the partial derivative characteristic curve, and if the judgment is that the SOC threshold is included in the partial derivative characteristic curve, the maximum capacity computer estimates the maximum capacity.

In some cases, the maximum capacity computation ability determiner determines whether or not difference between the maximum value and the minimum value of the value dV/dQ in the partial derivative characteristic curve of the second relationship of correspondence exceeds a third threshold set beforehand, and wherein, if the maximum capacity computation ability determiner determines that the difference between the maximum value and the minimum value of the value dV/dQ in the partial derivative characteristic curve of the second relationship of correspondence exceeds the third threshold set beforehand, the maximum capacity computer estimates the maximum capacity $Q_{max}$.

In some cases, the secondary battery capacity measurement system may further include an averaging processor that performs piecewise or moving averaging processing in a prescribed time range with respect to measured values obtained as a voltage V and current I of a charged and discharged battery in a time sequence, so as to take the determined average value as time sequential data of the measured value.

In some cases, the SOC computer has an SOC error computer that computes the error between the reference derivative curve and the partial derivative characteristic curve, the SOC error computer, using a reference derivative curve of the second relationship of correspondence, which has been corrected by the partial derivative characteristic curve of the second relationship of correspondence in the reference derivative curve reconstructor, computes the difference between the reference derivative curve and the partial derivative characteristic curve to optimize as the variable the capacity that has been integrated at the starting point of the partial derivative characteristic curve, and the SOC computer re-estimates the SOC by the optimized capacity.

In some cases, the maximum capacity computer has a maximum capacity error computer that computes the difference between the reference derivative curve and the partial derivative characteristic curve. The difference is computed between the partial derivative characteristic curve of the first relationship of correspondence and reference derivative curve of the first relationship of correspondence, or between the partial derivative characteristic curve of the second relationship of correspondence and the reference derivative curve of the second relationship of correspondence and the partial derivative characteristic curve of the first relationship of correspondence is optimized. The reference derivative curve reconstructor corrects the reference derivative curve of the first relationship of correspondence by the optimized partial derivative characteristic curve of the first relationship of correspondence. The maximum capacity computer, by integrating the reference derivative curve of the first relationship of correspondence that has been corrected by the partial derivative characteristic curve of the first relationship of correspondence within the range of the prescribed voltage value V, computes the maximum capacity of the second battery.

In some cases, if there is a plurality of peaks in the partial derivative characteristic curve of the first relationship of correspondence, when the difference is computed between the reference derivative curve and the partial derivative characteristic curve of the first relationship of correspondence, the maximum capacity error computer uses the distances between the peak spacing as one of the parameters in computing errors, and the maximum capacity computer, by integrating the reference derivative curve of the first relationship of correspondence that has been corrected by the peak values of the partial derivative characteristic curve of the first relationship of correspondence within the range of the prescribed voltage value V, computes the maximum capacity of the second battery.

In some cases, the SOC computer and the maximum capacity computer are resistively configured to estimate the SOC and the maximum value of capacity in parallel processing.

In another aspect, a second battery capacity measurement method may include, but is not limited to, the following steps. There is determined a partial derivative characteristic curve of a capacity-to-voltage derivative over voltage, the partial derivative characteristic curve indicating a characteristic of a capacity-to-voltage derivative, from a set of historical data of time-sequentially-measured values of voltage and current. There is computed a difference between the partial derivative characteristic curve and a reference derivative curve indicating a reference characteristic of the capacity-to-voltage derivative. The partial derivative characteristic curve is fitted to the reference derivative curve by reducing the difference, to estimate an SOC. There is estimated a maximum value of capacity, from the partial derivative characteristic curve and the reference derivative curve. The reference derivative curve is given by a complex of first and second characteristic derivative curves, the first characteristic derivative curve is derived from a positive material of a battery positive electrode, and the second characteristic derivative curve is derived from a negative material of a battery negative electrode.

In some cases, the reference derivative curve is given by a separating curve complex of the first and second characteristic derivative curves.

In some cases, the first and second characteristic derivative curves are approximated with first and second functions which include first and second characteristic parameters of phase transition of the positive material and the negative material, respectively; and the curves of the first and second functions are adjustable by the first and second characteristic parameters, respectively.

In some cases, the SOC computer and the maximum capacity computer are resistively configured to estimate the SOC and the maximum value of capacity in parallel processing.

As described above, according to the embodiments of the present invention, under a condition in which the battery is caused to operate in a normal mode, it is possible to simply and in a short period of time estimate the SOC and the maximum capacity of a battery, without acquiring beforehand the correlation relationship between a characteristic quantity of the object under measurement and the maximum capacity when deteriorated, and without leaving the operating range of the SOC.

BRIEF DESCRIPTION OF THE DRAWINGS

FIG. 15 is an example of a table showing the quantification of the degree of deterioration of the positive electrode and the negative electrode of a battery.

EMBODIMENTS

Figure 1:
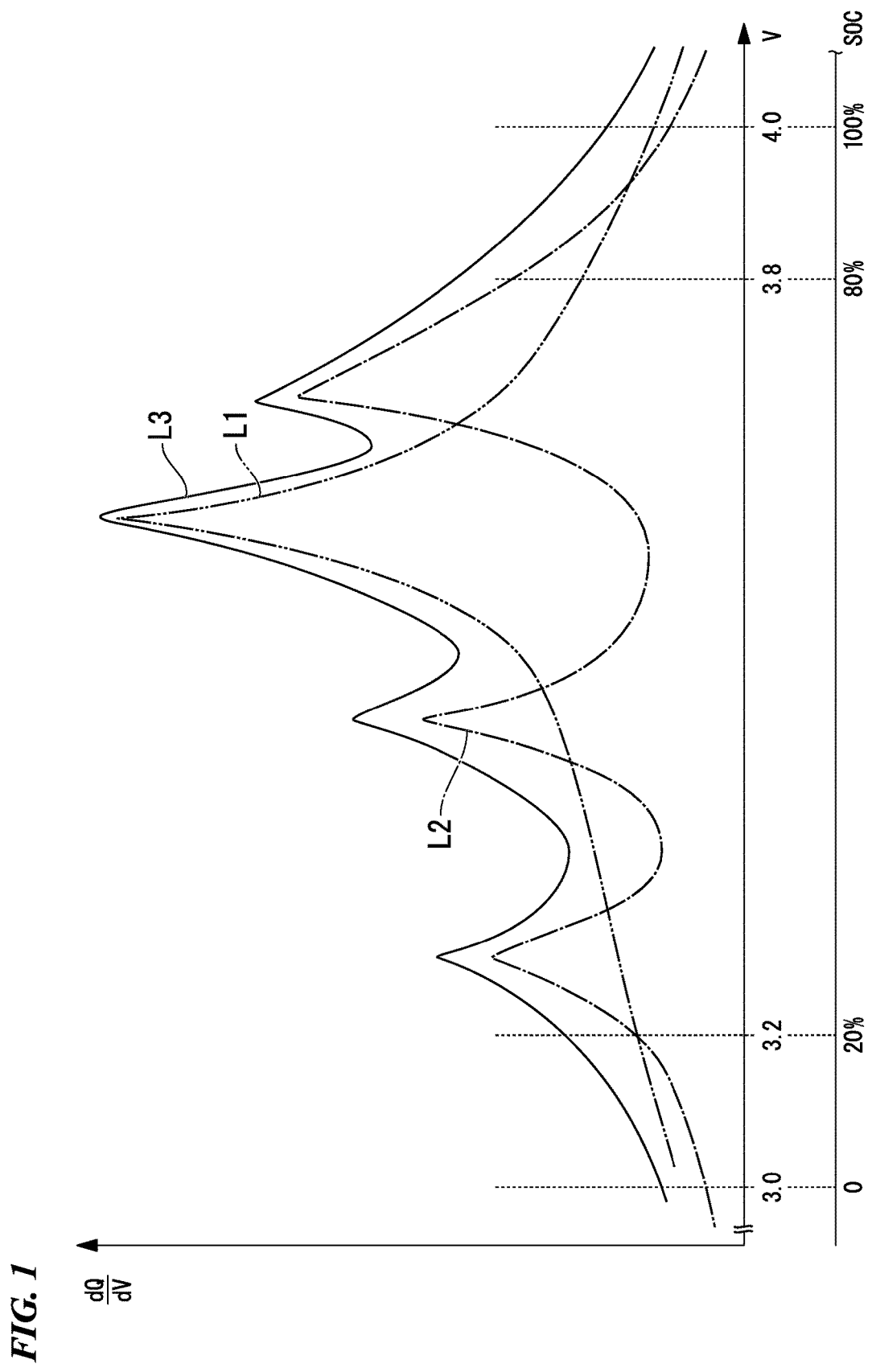
FIG. 1 is a drawing showing the correspondence between the first reference derivative curve and the separated waveform derivative curves derived from each of the positive electrode and the negative electrode.

The reference used in the present invention in determining the SOC and the maximum capacity of a battery such as a secondary battery is generated from the derivative curve of a separated waveform model by the derivative of the voltage value V and capacity Q by the positive and negative electrodes determined by simulation using the materials characteristics of each of the positive and negative electrodes of the secondary battery.

That is, the positive electrode and the negative electrode of the secondary battery have characteristic separated waveform derivative curves as waveform separation models for each thereof, due to a phase transition phenomenon characteristic to each of the electrode materials (for example, the derivative curve representing the correspondence between the derivative value dQ/dV and the voltage value V). These separated waveform derivative curves for the positive electrode and the negative electrode have different characteristic peaks. In this case, functions such as the Gaussian function or the Lorentzian function, or functions that include an asymmetry factor can be used to express the separated waveform models deriving from the positive electrode and the negative electrode. That is, the separated waveform derivative curves of the single electrode for each of the positive electrode and the negative electrode are formed to be approximated by a function corresponding to each of peaks. If, for example, the separated waveform derivative curves of the single electrode have three peaks, each of the first function to the third function, corresponding to each of peaks synthesizes this separated waveform derivative curves.

Therefore, the characteristic derivative curve of the synthesized waveforms from the separated waveform derivative curve approximated by a peak function can be observed as the characteristics (derivative curve) of the overall battery constituted by the positive electrode and the negative electrode. For this reason, the separated waveform derivative curves of the single electrode for each of the positive electrode and the negative electrode are each determined by a simulation, so that, using the above-described arbitrary equations, fitting is performed with actually measured data in which the characteristic derivative curves of the synthesized waves are actually measured. The separated waveform derivative curves derived from the positive electrode and the negative electrode, which are constituted by synthesis by functions, are then synthesized to generate the characteristic derivative curve indicating the correspondence between the derivative value dQ/dV and the voltage value V as a battery. The characteristic derivative curve that indicates the correspondence between the derivative value dQ/dV and the voltage value V is taken as the first reference derivative curve. In the first reference derivative curve, the maximum capacity $Q_{max}$ of the battery is estimated (computed) by integrating the derivative value dQ/dV by the voltage value V over the voltage range of use (operating voltage).

FIG. 1 shows the correspondence between the first reference derivative curve and the separated waveform derivative curves derived from each of the positive electrode and the negative electrode in the embodiment of the present invention. In FIG. 1, the vertical axis represents the derivative value dQ/dV and the horizontal axis represents the voltage value V. The curve L1 indicates the separated waveform derivative curve derived from the positive electrode, the curve L2 indicates the separated waveform derivative curve derived from the negative electrode, and the curve L3 indicates the characteristic derivative curve obtained by synthesizing the curves L1 and L2. If the voltage from 3.0 V to 4.0 V is the voltage range in which supply to the load is possible, the capacity supplied in the voltage range from 3.0 V to 4.0 V is the maximum capacity $Q_{max}$ in the specifications of this battery. An axis representing the SOC is provided below and parallel with the horizontal axis, this indicating the proportion of remaining capacity at each voltage, relative to the above-noted maximum capacity $Q_{max}$.

Figure 2:
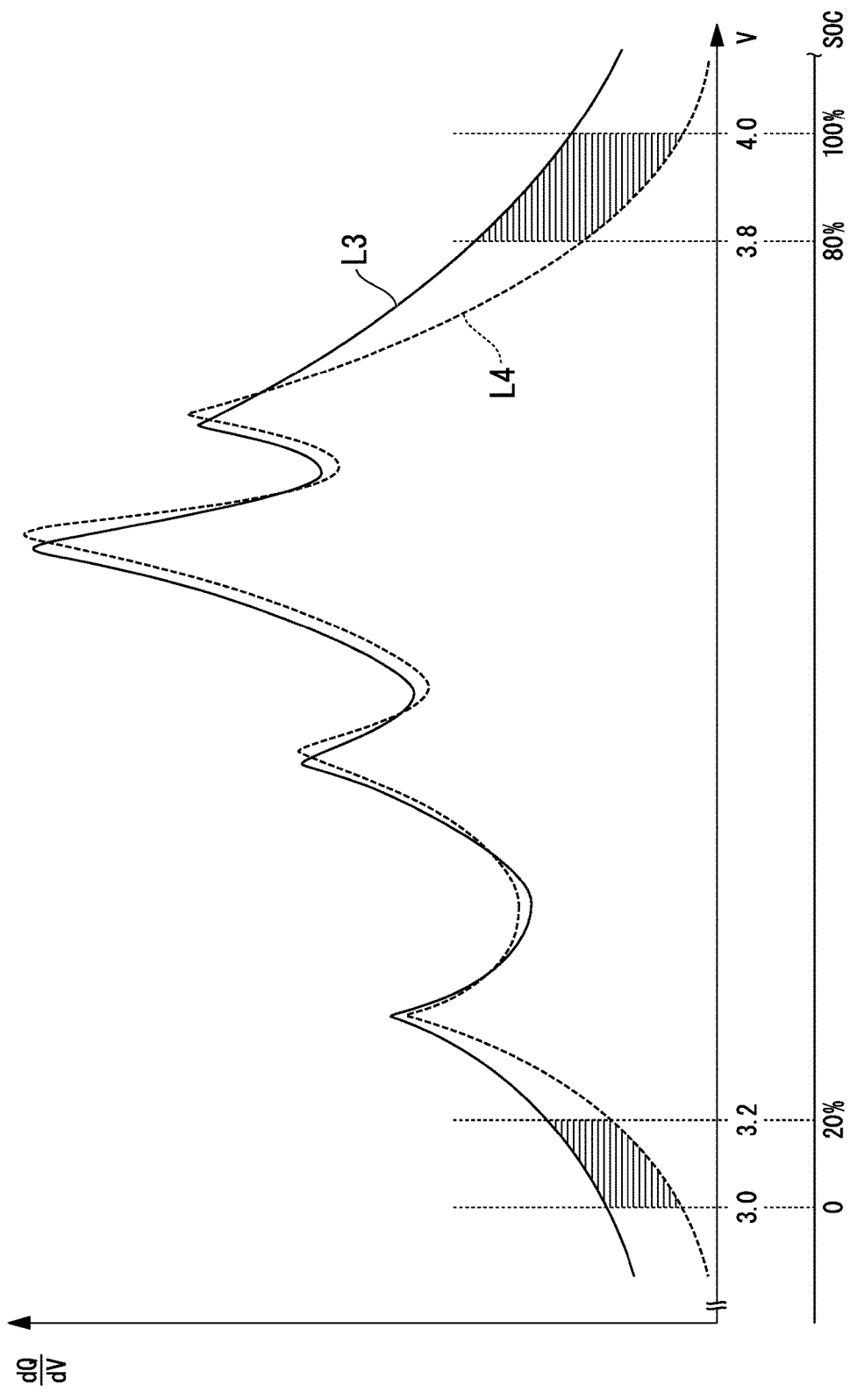
FIG. 2 is a drawing describing the generation of the first reference curve by a fitting of the characteristic derivative curve using actually measured values.

FIG. 2 describes the generation of the first reference curve by a fitting of the characteristic derivative curve using actually measured values. In FIG. 2, the vertical axis represents the derivative value dQ/dV and the horizontal axis represents the voltage value V. The solid line (curve L3) indicates the characteristic derivative curve, and the dotted line (L4) indicates the measured characteristic derivative curve determined by actual measurement of the battery.

After generating the characteristic derivative curve L3 by synthesizing the separated waveform derivative curves derived from the positive electrode and the negative electrode, the characteristic derivative curve is fit, using the measured characteristic derivative curve L4. In this case, the parameters in functions representing each of the separated waveform derivative curves derived from the positive electrode and the negative electrode forming the characteristic derivative curve are adjusted. Optimization with respect to the measured characteristic derivative curve is done of the characteristic derivative curve L3 synthesized from the separated waveform derivative curves derived from the positive electrode and the negative electrode. The parameters in the above-noted functions are, for example, the peak heights, the peak widths, and the distances between peaks.

That is, the parameters in functions of each of the separated waveform derivative curves derived from the positive electrode and the negative electrode are adjusted to perform fitting between the characteristic derivative curve L3 and the measured characteristic derivative curve L4. The adjusted separated waveform derivative curves derived from the positive electrode and the negative electrode are then synthesized, and processing to generate a new characteristic derivative curve and to compare that characteristic derivative curve with the measured characteristic derivative curve is repeatedly performed, until the absolute value of the difference (error) between the characteristic derivative curve and the measured characteristic derivative curve is minimized, thereby optimizing the shape of the characteristic derivative curve so that it approximates the measured characteristic derivative curve. In the embodiments of the present invention, the characteristic derivative curve at the point in time when the absolute value of the difference is minimum is referred to as the first reference derivative curve.

In FIG. 2, the shaded regions in the range from 3.0 V to 3.2 V and the range from 3.8 V to 4.0 V indicate ranges in which the difference between the characteristic derivative curve obtained by simulation and the measured characteristic derivative curve is large, making fitting difficult. That is, the shaded regions in the range from 3.0 V to 3.2 V and the range from 3.8 V to 4.0 V are regions in which representation by simulation using a separated waveform model is difficult. Therefore, if a first reference derivative curve generated by only adjustment of the characteristic derivative curve determined by simulation is used to determine the maximum capacity $Q_{max}$, an difference of the capacity Q of the shaded parts of FIG. 2 is included in the maximum capacity $Q_{max}$ determined by integrating the derivative value dQ/dV over the voltage range of use.

For this reason, in the embodiments of the present invention, in the first reference derivative curve in the regions corresponding to the shaded regions, replacement is done by the measured values in corresponding regions of the actually measured characteristic derivative curves. It has been determined by experiment that, in a region in which the difference is large, compared with other regions, change due to deterioration is very small, so that, compared with the use of a characteristic derivative curve determined by simulation, it is possible to suppress the difference in the maximum capacity $Q_{max}$.

Also, to simplify the processing, a first reference derivative curve may be determined using only a characteristic curve determined by simulation and used.

In the case of a lithium ion secondary battery, because of slight differences in the amounts of activated material and pre-doping at the time of manufacture of the battery, even in the same lots, there might be slight individual product-to-product differences in the maximum capacity $Q_{max}$. These are attributed to the difference in characteristics between individual products in the regions, in which the slope is steep at the two ends of the curve representing the relationship between the capacity Q and the voltage value V. The regions at the two ends of the curve representing the relationship between the capacity Q and the voltage value V are regions in which there is a large change in voltage, and in which slight differences in the pre-doping amount in the positive electrode and negative electrode of the battery cause large differences in the characteristics.

As described above, because these are regions that are highly sensitive, it is very difficult to make a representation by synthesizing a waveform separation model.

In the embodiments of the present invention, if the initial data in the sloping regions at each end of the curve representing the relationship between the capacity Q and the voltage value V of an individual battery are acquired beforehand, the characteristics outside of a voltage region set beforehand by thresholds (Vlower and Vupper), as described above, may be constructed using a curve of the characteristics between the capacity Q and the voltage value V measured and stored beforehand.

That is, in the embodiments of the present invention, in a region in which representation by synthesis of a waveform separation model is difficult, it is possible to make a more accurate estimation of the maximum capacity $Q_{max}$ by constructing the first reference derivative curve model using initial actually measured data of the battery.

Figure 3:
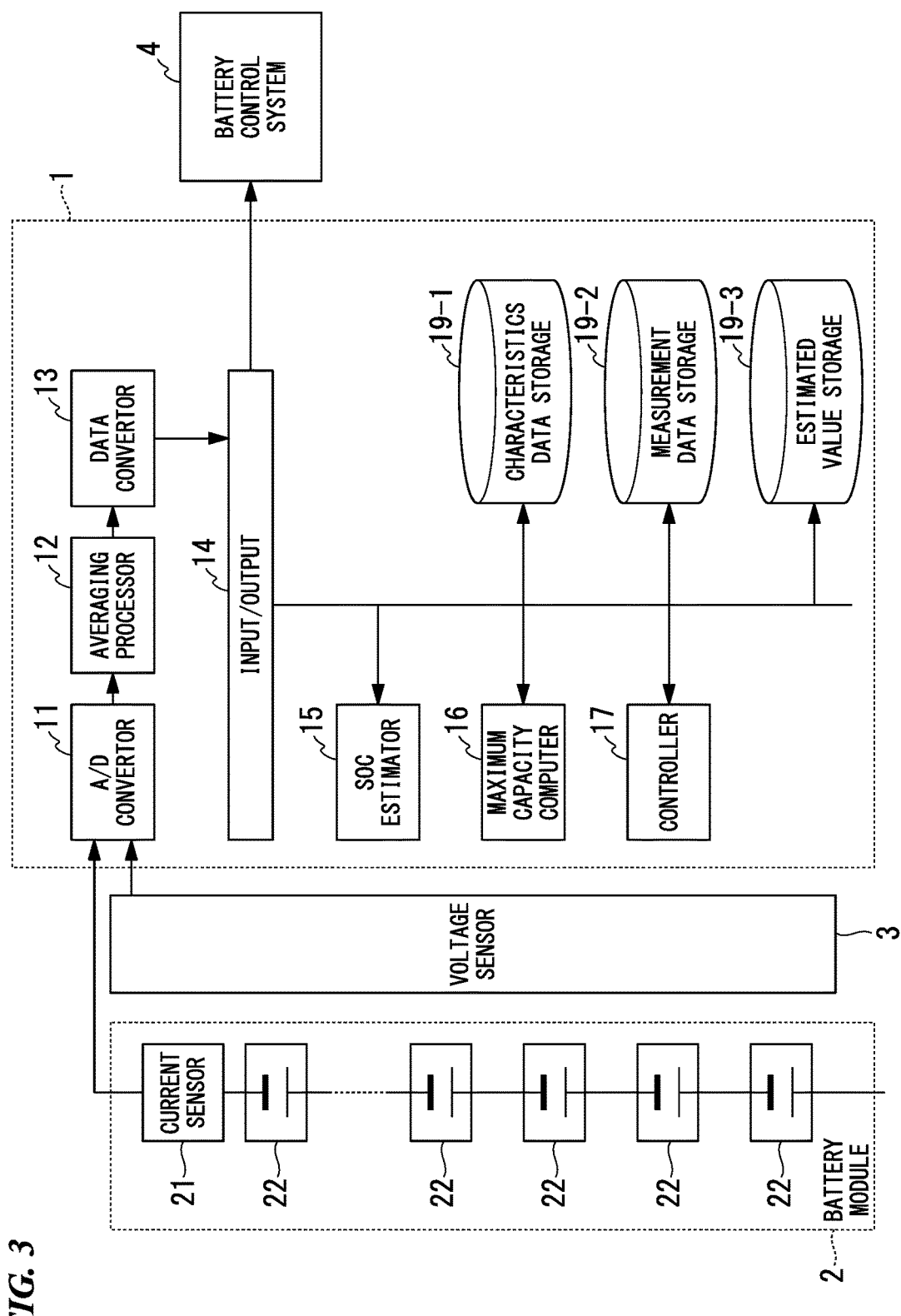
FIG. 3 is a drawing showing an example of the constitution of a secondary battery capacity measurement system according to the first embodiment of the present invention.

A secondary battery capacity measurement system according to one embodiment of the present invention using the above-described waveform separation model will be described below, with references made to the drawings. FIG. 3 shows an example of the constitution of the secondary battery capacity measurement system according to the first embodiment of the present invention. A secondary battery capacity measurement system 1 has an A/D convertor 11, an averaging processor 12, a data convertor 13, an input/output 14, an SOC computer 15, a maximum capacity computer 16, a controller 17, a characteristics data storage 19-1, a measurement data storage 19-2, and an estimated value storage 19-3. A battery module 2 is constituted by a current sensor 21 and a plurality of batteries 22, and supplies electric power to a load (not shown). In this case, the current sensor 21 measures the current value I flowing in the battery module 2. A voltage sensor 3 measures the voltage between terminals of battery module 2, which is the voltage value of all the connected batteries or the voltage across the terminals of each individual battery 22 constituting the battery module 2. A battery control system 4 controls the operations of charging and discharging the battery module 2 by means of the SOC and the maximum capacity $Q_{max}$ supplied from the secondary battery capacity measurement system 1.

A/D convertor 11 samples the voltage value V measured by the voltage sensor 3 and the current value I measured by the current sensor 21 at a prescribed sampling period and converts the measured values of the sampled analog data to digital data.

The averaging processor 12 performs averaging processing on each of the current values I and voltage values V actually measured and converted to digital data and outputs the result. For example, in order to reduce the number of data points, averaging processing is performed on digital data for 10 sampling periods, so that the amount of data is 1/10 with respect to the sampling period. This averaging processing uses averaging such as piecewise averaging or a moving average. The averaging processor 12 integrates the current value I over a prescribed time period and computes the capacity Q as the variation amount in the capacity over that prescribed period of time.

The data convertor 13, using the averaged voltage value V and the computed capacity Q, generates a set of data that indicates the correspondence between the derivative value dQ/dV obtained by taking the derivative of the capacity Q using the differential operator d/dV, the voltage value V, and the current value I, and outputs this in time sequence to the input/output 14.

The data convertor 13, using the averaged voltage value V and the computed capacity Q, generates a set of data that indicates the correspondence between the derivative value dV/dQ obtained by taking the derivative of the capacity Q using the differential operator d/dQ, the capacity Q, and the current value I, and outputs this in time sequence to the input/output 14.

The input/output 14 writes into and stores in the measurement data storage each of the time sequences of the data set of the derivative value dQ/dV and the voltage value V, and of the derivative value dV/dQ and the capacity Q that are supplied from the data convertor 13. In this case, the measurement data storage has a storage capacity for the data sets of a prescribed time period. The measurement data storage 19-2 is, for example, a ring buffer that stores a time sequence data set for a length of one hour and, if one hour is exceeded, successively overwrites the old data set with the new data set.

The input/output 14 outputs the SOC estimated by the SOC computer 15 to be described later and the maximum capacity $Q_{max}$ estimated by the maximum capacity computer 16 to the battery control system 4.

The SOC computer 15 estimates the SOC, using a first partial derivative characteristic curve formed from a data group over a prescribed period of time of a data set indicating the correspondence between the derivative value dQ/dV and the voltage value V and a second partial derivative characteristic curve formed from a data group over a prescribed period of time of a data set indicating the correspondence between the derivative value dV/dQ and the capacity Q. The SOC computer 15 makes an estimation (which will described later) of whether or not the SOC can be estimated, using the first reference derivative curve and the first partial derivative characteristic curve. The SOC computer 15 estimates the SOC, using a second reference derivative curve and the second partial derivative characteristic curve. The second reference derivative curve is a derivative curve indicating the correspondence between the derivative value dV/dQ determined using the first reference derivative curve as a reference and the capacity Q.

The SOC computer 15 writes into and stores in the estimated value storage 19-3 the newly estimated SOC.

Using the first partial derivative characteristic curve formed from a data group over a prescribed period of time of the time sequence of a data set indicating the correspondence between the derivative value dQ/dV and the voltage value V and the second partial derivative characteristic curve formed from a data group over a prescribed period of time of the time sequence of a data set indicating the correspondence between the derivative value dV/dQ and the capacity Q, the maximum capacity computer 16 estimates the maximum capacity $Q_{max}$ and writes into and stores in the estimated value storage 19-3 the newly estimated maximum capacity $Q_{max}$.

The controller 17 is constituted by a CPU (central processing unit) or the like and controls the operation of various parts of the secondary battery capacity measurement system 1.

Each of the first reference derivative curves and the second reference derivative curves is written into and stored in the characteristics data storage 19-1.

The measurement data storage 19-2 is a ring buffer that stores a time sequence data set for a prescribed length of a certain time and, if a certain time is exceeded, successively overwrites old data set with new data set.

Each of the specified maximum capacity $Q_{max}$ and the SOC is stored in the estimated value storage 19-3.

Figure 4:
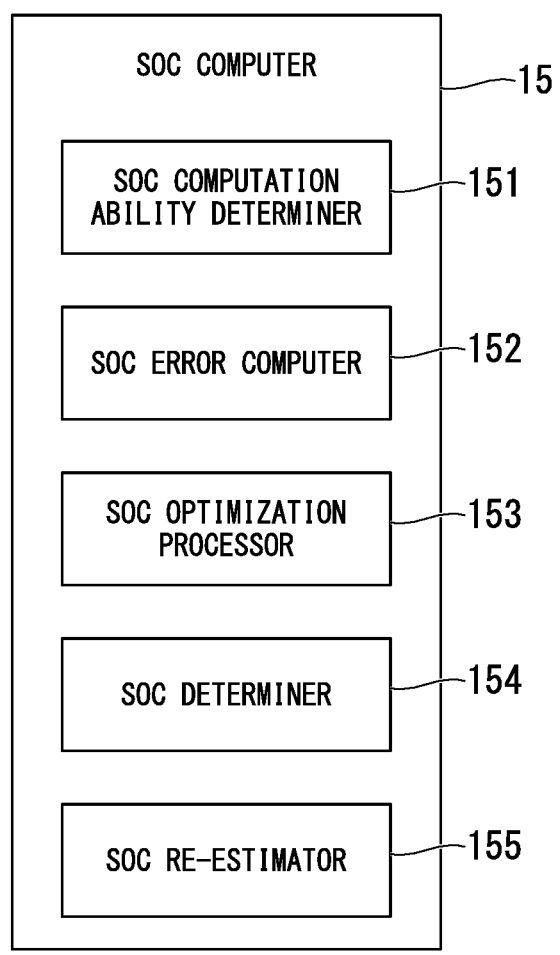
FIG. 4 is a drawing showing an example of the constitution of an SOC computer 15 shown in FIG. 3 in the first embodiment.

FIG. 4 shows an example of the constitution of the SOC computer 15 of FIG. 3 in the embodiments of the present invention. The SOC computer 15 has an SOC computation ability determiner 151, an SOC error computer 152, an SOC optimization processor 153, an SOC determiner 154, and an SOC re-estimator 155.

Figure 5:
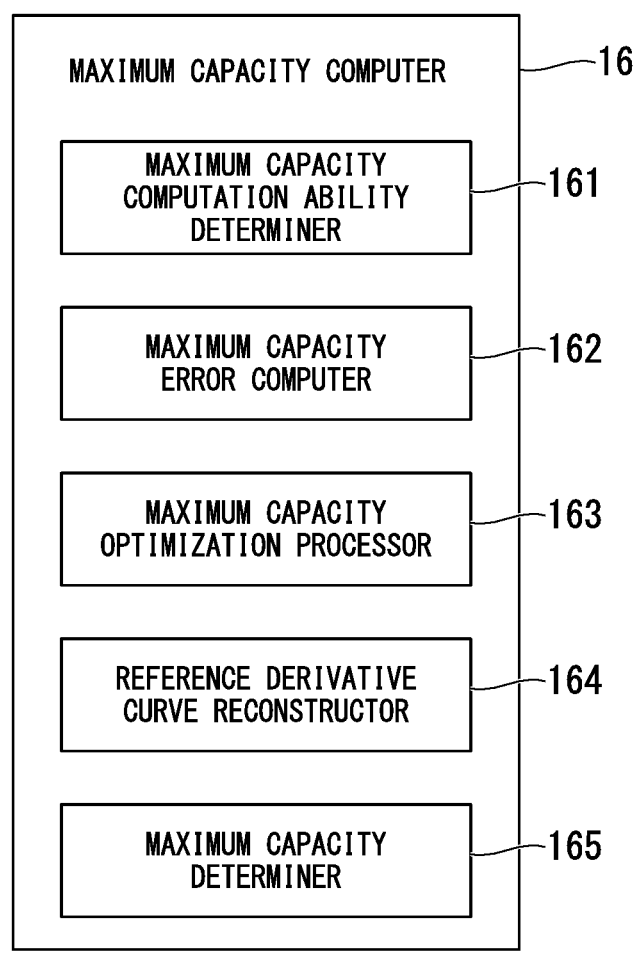
FIG. 5 is a drawing showing an example of the constitution of a maximum capacity computer 16 in FIG. 3 in the first embodiment.

FIG. 5 shows an example of the constitution of the maximum capacity computer 16 of FIG. 3 in the embodiments of the present invention. The maximum capacity computer 16 has a maximum capacity computation ability determiner 161, a maximum capacity error computer 162, a maximum capacity optimization processor 163, a reference derivative curve reconstructor 164, and a maximum capacity determiner 165.

(Measurement of the Voltage Value V and the Current Value I)

The A/D convertor 11 samples each of the voltage value V output by the voltage sensor 3 and the current value I output by the current sensor 21 at a prescribed sampling period.

The A/D convertor 11 then converts each of the sampled voltage value V and current value I from analog data to digital data, and outputs them to the averaging processor 12.

The averaging processor 12 performs averaging processing, using a prescribed averaging method, on each of the voltage values V and the current values I actually measured and converted to digital data, and outputs the result to the data convertor 13. The averaging processor 12 integrates the current value I over an averaging time period and computes the capacity Q as the variation amount in the capacity over that prescribed period of time.

The data convertor 13, using the averaged voltage value V and the computed capacity Q, generates a set of data that indicates the correspondence between the derivative value dQ/dV obtained by taking the derivative of the capacity Q using the differential operator d/dV, the voltage value V, and the current value I, and outputs this in time sequence to the input/output 14.

The data convertor 13, using the averaged voltage value V and the computed capacity Q, generates a set of data that indicates the correspondence between the derivative value dV/dQ obtained by taking the derivative of the capacity Q using the differential operator d/dQ, the capacity Q, and the current value I, and outputs this in time sequence to the input/output 14.

Figure 6:
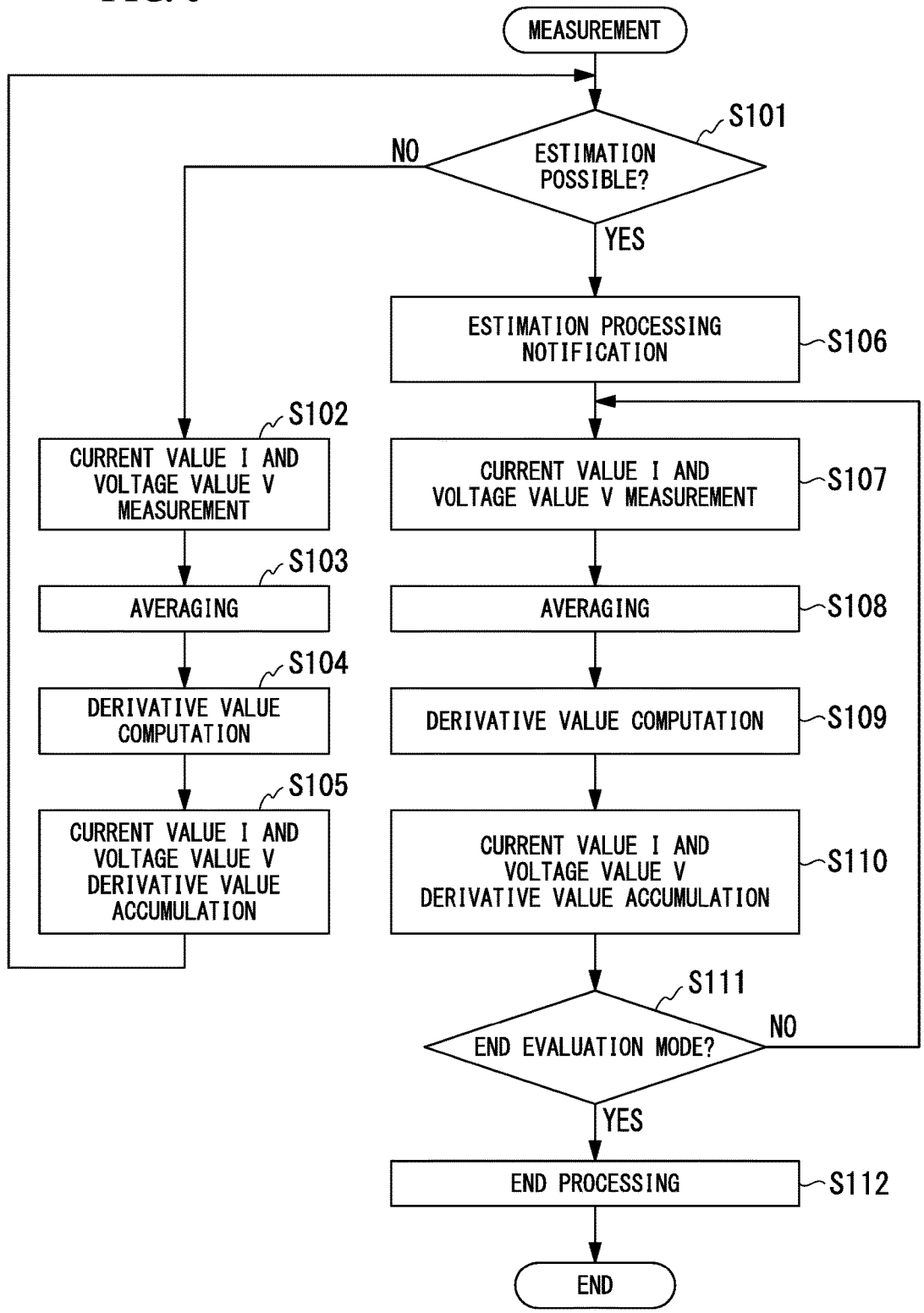
FIG. 6 is a flowchart showing the operations of measuring the voltage value V and the current value I.

FIG. 6 is a flowchart showing the operation of measuring the voltage value V and the current value I.

Step S101:

The controller 17 determines whether or not a set of a number of each of the voltage values V and the current values I sufficient to enable estimation of the SOC and the maximum capacity $Q_{max}$ has been measured.

When this is done, if a set of a number of each of the voltage values V and the current values I sufficient to enable estimation of the SOC and the maximum capacity $Q_{max}$ had been measured, the controller 17 processing proceeds to step S106.

If, however, a set of a number of each of the voltage values V and the current values I sufficient to enable estimation of the SOC and the maximum capacity $Q_{max}$ had not been measured, the controller 17 processing proceeds to step S102.

Step S102:

The A/D convertor 11 samples the current value I output from the current sensor 21 and the voltage value V output from the voltage sensor 3 and converts each of the analog data thereof to digital data.

Step S103:

The averaging processor 12 averages each of the current values I and the voltage values V over a prescribed time period, thereby reducing the number of data.

The averaging processor 12 integrates the current values I from the time data and computes the capacity Q that varies over the above-noted prescribed period of time.

Step S104:

The data convertor 13 computes each of the derivative value dQ/dV obtained by taking the derivative of the capacity Q using the differential operator d/dV and the derivative value dV/dQ obtained by taking the derivative of the voltage value V using the differential operator d/dQ.

The data convertor 13 then outputs the data set of the voltage value V, the current value I, the capacity Q, the derivative value dQ/dV, and the derivative value dV/dQ in time sequence to the input/output 14.

Step S105:

The controller 17 writes into and stores in the measurement data storage 19-2 in time sequence the data set of the voltage value V, the current value I, the capacity Q, the derivative value dQ/dV, and the derivative value dV/dQ supplied to the input/output 14 (data accumulation).

The controller 17 processing then proceeds to step S101.

Step S106:

Because a set of voltage values V and current values I of a number enabling estimation of each of the SOC and the maximum capacity $Q_{max}$ has been measured and accumulated in the measurement data storage 19-2, the controller 17 outputs to the SOC computer 15 and the maximum capacity computer 16 a control signal indicating that estimation processing is possible.

The controller 17 processing then proceeds to step S107.

Because each of step S107 to step S110 is the same as step S102 to step S105, respectively, the descriptions thereof will be omitted. In this case, after the completion of the processing of step S110, the controller 17 processing proceeds to step S111.

Step S111:

The controller 17 determines whether or not to end the evaluation mode in which the estimations of SOC and the maximum capacity $Q_{max}$ are performed.

When this is done, if the evaluation mode is not to be ended, the controller 17 processing proceeds to step S107, and if the evaluation mode is to be ended, proceeds to step S112.

With regard to whether or not the evaluation mode is to be ended, the constitution may be one in which the judgment is made by a flag set by the user. That is, the controller 17 sets a flag indicating the evaluation mode if the user sets the evaluation mode, and clears the flag if the user makes a setting to end the evaluation mode. This enables easy detection that the operating mode is the evaluation mode if the flag is set and that it is not the evaluation mode but rather the normal mode if the flag is cleared.

Step S112:

The controller 17 outputs a control signal indicting the end of the estimation of the SOC and the maximum capacity $Q_{max}$ to the SOC computer 15 and the maximum capacity computer 16.

This causes the SOC computer 15 to end the estimation processing of the SOC, and the maximum capacity computer 16 ends processing of the estimation of the maximum capacity $Q_{max}$.

(SOC Estimation)

The processing to estimate the SOC in the embodiments of the present invention will be described below, with references made to FIG. 3 and FIG. 4. The SOC computation ability determiner 151 reads from the measurement data storage 19-2 the data group over a prescribed period of time for a data set indicating the correspondence between the derivative value dQ/dV and the voltage value V and generates the first partial derivative characteristic curve from that data group. The SOC computation ability determiner 151 then determines whether or not the first partial derivative characteristic curve can be used to estimate the SOC. That is, the SOC computation ability determiner 151 compares the first threshold of the derivative value dQ/dV that had been set beforehand with the derivative value dQ/dV in the first partial derivative characteristic curve.

Figure 7:
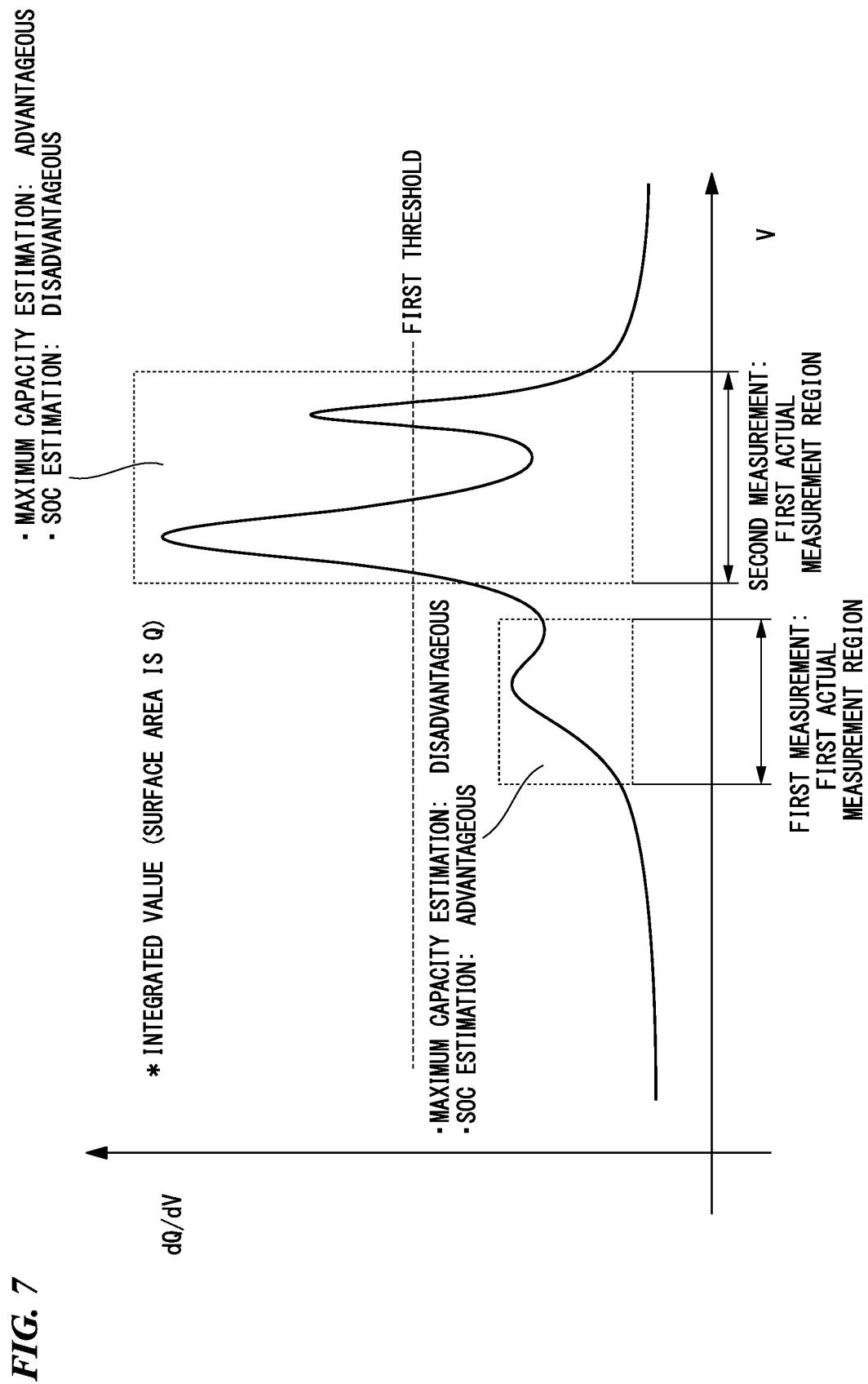
FIG. 7 is a drawing describing the judgment of whether or not the estimation of the SOC and the maximum capacity $Q_{max}$ can be done from the acquired first partial derivative characteristic curve.

FIG. 7 describes the judgment of whether or not it is possible to estimate the SOC and the maximum capacity $Q_{max}$ from the acquired first partial derivative characteristic curve. In FIG. 7, the vertical axis represents the derivative value dQ/dV and the horizontal axis represents the voltage value V. In FIG. 7, the first threshold of the derivative value dQ/dV is set beforehand to a value that has a small amount of change of the capacity Q with respect to a change in the voltage value V and also a value that makes the sensitivity to deterioration small. That is, the higher is the derivative value dQ/dV with respect to the first threshold, the stronger is the peak strength of the derivative value dQ/dV. A region in which the first peak strength of the derivative value dQ/dV is high, compared with a region in which the peak strength is low, has a large absolute value of sensitivity to deterioration and a large contribution to a large capacity. In contrast, the smaller is the derivative value dQ/dV with respect to the first threshold, the lower is the peak strength of the derivative value dQ/dV. A region in which the peak strength of the derivative value dQ/dV is low, compared with a region in which the peak strength thereof is high, has a small absolute value of sensitivity to deterioration and a small contribution to a large capacity. For this reason, it is possible to estimate the SOC with high accuracy by using the first partial derivative characteristic curve formed by the derivative value dQ/dV, which has a low sensitivity with respect to deterioration lower than the first threshold. In contrast, it is possible to estimate the maximum capacity $Q_{max}$ with high accuracy by using the first partial derivative characteristic curve formed by the derivative value dQ/dV, which has a high sensitivity with respect to deterioration at or above the first threshold.

Returning to FIG. 3 and FIG. 4, if the maximum value of the derivative value dQ/dV in the first actual measurement region is less than the first threshold, the SOC computation ability determiner 151 determines that this is a region in which a change in the SOC is little influenced by the change in the maximum capacity caused by deterioration, making it possible to compute the SOC (first SOC computation ability judgment condition).

The SOC computation ability determiner 151, using the voltage value V and the capacity Q used in the computation of first partial derivative characteristic curve, generates the second partial derivative characteristic curve, which indicates the correspondence between the derivative value dV/dQ and the capacity Q. The SOC computation ability determiner 151 computes the difference $((dV/dQ)_{max}-(dV/dQ)_{min})$ between the maximum value $(dV/dQ)_{max}$ and the minimum value $(dV/dQ)_{min}$ of the derivative value dV/dQ in the second partial derivative characteristic curve and, if the difference value exceeds the second threshold set beforehand, determines that the change in the derivative value dV/dQ with respect to the capacity Q is large, making this a region in which the characteristics are clearly distinctive.

For this reason, an additional condition for the SOC computation ability determiner 151 judging that the SOC can be computed may be that, in addition to the above-described first SOC computation ability judgment condition, whether the difference value between the maximum value $(dV/dQ)_{max}$ and the minimum value $(dV/dQ)_{min}$ in the region of the second partial derivative characteristic curve exceeds a second threshold set beforehand (second SOC computation ability judgment condition).

Figure 8:
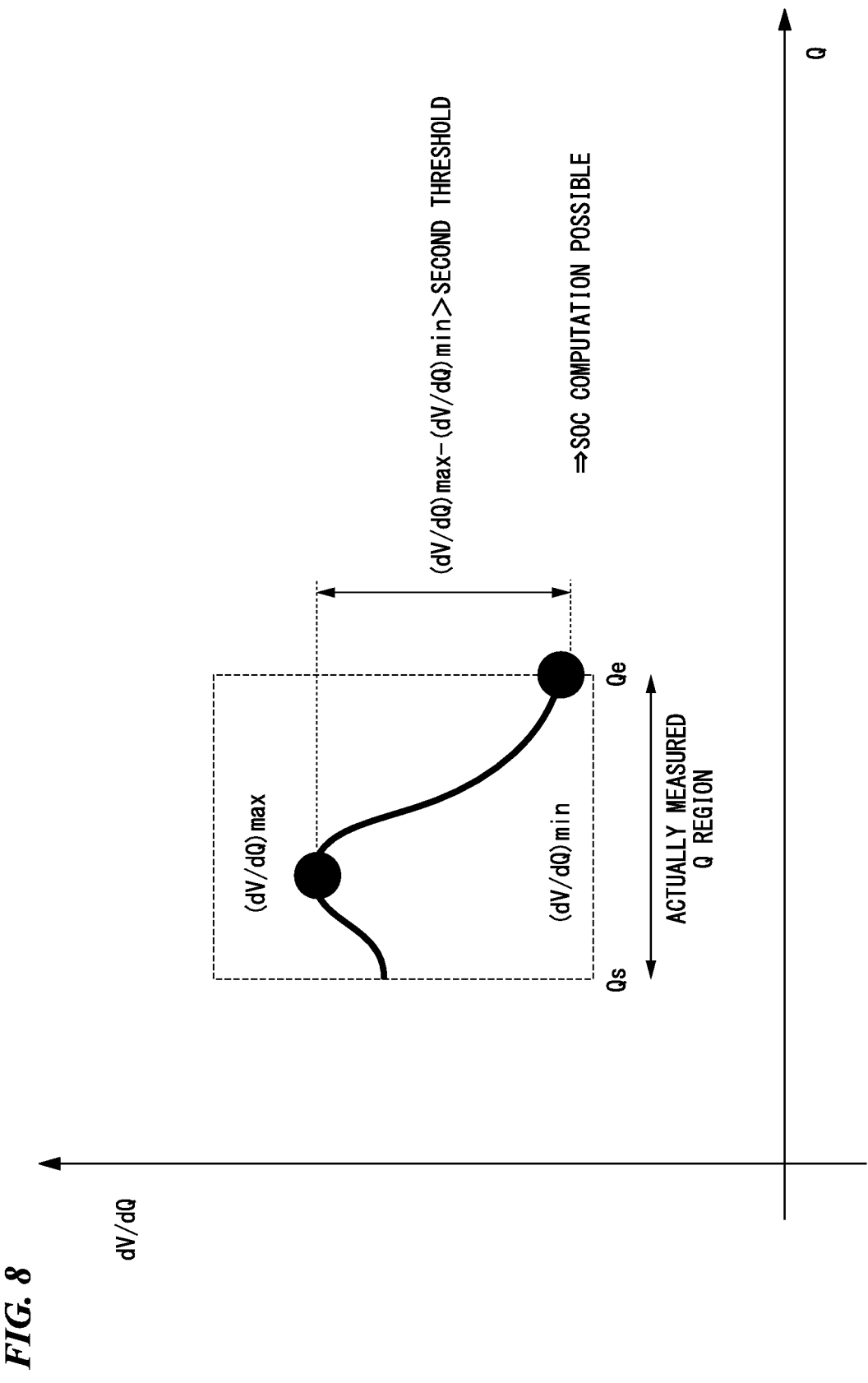
FIG. 8 is a drawing describing the processing to determine whether or not the SOC can be computed by a second SOC computation ability judgment condition.

FIG. 8 describes the process for judging whether or not the SOC can be computed, in accordance with the second SOC computation ability judgment condition. In FIG. 8, the vertical axis represents the derivative value dV/dQ, the horizontal axis represents the capacity Q, $(dV/dQ)_{max}$ is the maximum value of dV/dQ in the actually measured Q region, and $(dV/dQ)_{min}$ is the minimum value of dV/dQ in the actually measured Q region.

Returning to FIG. 3 and FIG. 4, the SOC computation ability determiner 151 extracts the maximum value $(dV/dQ)_{max}$ and the minimum value $(dV/dQ)_{min}$ in the second partial derivative characteristic curve region (first actually measured region). The SOC computation ability determiner 151 then computes the difference value between the extracted maximum value $(dV/dQ)_{max}$ and minimum value $(dV/dQ)_{min}$, and determines whether or not the computed difference value exceeds the second threshold.

The SOC error computer 152 reads the second reference derivative curve stored in the characteristic data storage 19-1. The SOC error computer 152 determines in the second partial derivative characteristic curve and the second reference derivative curve the difference of the derivative value dV/dQ in the region corresponding to the region of the capacity Q in the second partial derivative characteristic curve as the difference (evaluation value). That is, because the second partial derivative characteristic curve is a curve in a prescribed region of the capacity Q, the difference between the derivative value dV/dQ of the capacity Q in the second partial derivative characteristic curve and the derivative value dV/dQ of the capacity Q in the second reference derivative curve corresponding to the capacity Q of the second partial derivative characteristic curve is determined. The SOC error computer 152 then, for example, takes the sum of the squares S of the difference. Although the description of the embodiments of the present invention uses the sum of the squares, anything else may be used, as long as it can be used as a value for evaluating the optimization when fitting.

The SOC optimization processor 153 subjects the second partial derivative characteristic curve to parallel translation by only the change value ΔQ of the capacity Q set beforehand with respect to the horizontal axis in the direction that reduces the above-noted sum of the squares. As a result of the parallel translation, the value of the capacity Q with respect to the derivative values dV/dQ of each region on the second partial derivative characteristic curve changes.

Then, the SOC error computer 152, determines as the error (evaluation value) the difference in the derivative value dV/dQ for each of the same capacities Q in the second partial derivative characteristic curve subjected to parallel translation and in the second reference derivative curve in regions corresponding to new capacity Q regions in the second partial derivative characteristic curve that was subject to parallel translation.

In this case, the SOC optimization processor 153 detects the position of the capacity Q that makes the sum of the squares computed by the SOC error computer 152 minimum, while subjecting the second partial derivative characteristic curve to the above-noted parallel translation with respect to the horizontal axis. That is, the SOC optimization processor 153 performs optimization of the second reference derivative curve by fitting processing of the second partial derivative characteristic curve, and detects the range of the capacity Q of the curve shape in the second reference derivative curve that is similar to the curve shape of the second partial derivative characteristic curve.

The SOC determiner 154, in the range of the capacity Q of the optimized second partial derivative characteristic curve, extracts the minimum value (starting value of the range) of the capacity $Q_s$ and the maximum value (ending value of the range) of the capacity $Q_e$, and uses the minimum value of the capacity $Q_s$ as an estimation of the SOC when computing the SOC.

The maximum capacity $Q_{max}$ stored in the estimated value storage 19-3 is read out, the capacity $Q_s$ is divided by the maximum capacity value $Q_{max}$, and the SOC (%) is computed (estimated) by multiplying the result of the division by 100.

By fitting the above-described second partial derivative characteristic curve to the second reference derivative curve, the conversion error in the A/D convertor 11 included in the capacity $Q_s$ at the time of measurement is cancelled, enabling determination of the capacity $Q_s$ for estimating the SOC with a high accuracy.

Upon supply of an updating signal from the maximum capacity computer 16 that indicates that the maximum capacity $Q_{max}$ has been updated, the SOC re-estimator 155 performs processing to re-estimate the SOC.

That is, upon supply of the updating signal, the SOC re-estimator 155 determines the difference between the maximum capacity $Q_{max}$ used in estimating the immediately previous SOC and the maximum capacity $Q_{max}$ after updating stored in the estimated value storage 19-3.

Then, if the difference exceeds a pre-established threshold, the SOC re-estimator 155, with respect to the re-estimated first reference derivative curve and the second reference derivative curve, uses the immediately previous first partial derivative characteristic curve and the second partial derivative characteristic curve, so that the SOC computation ability determiner 151 causes the various parts of the SOC determiner 154 to re-estimate the SOC.

Figure 9A:
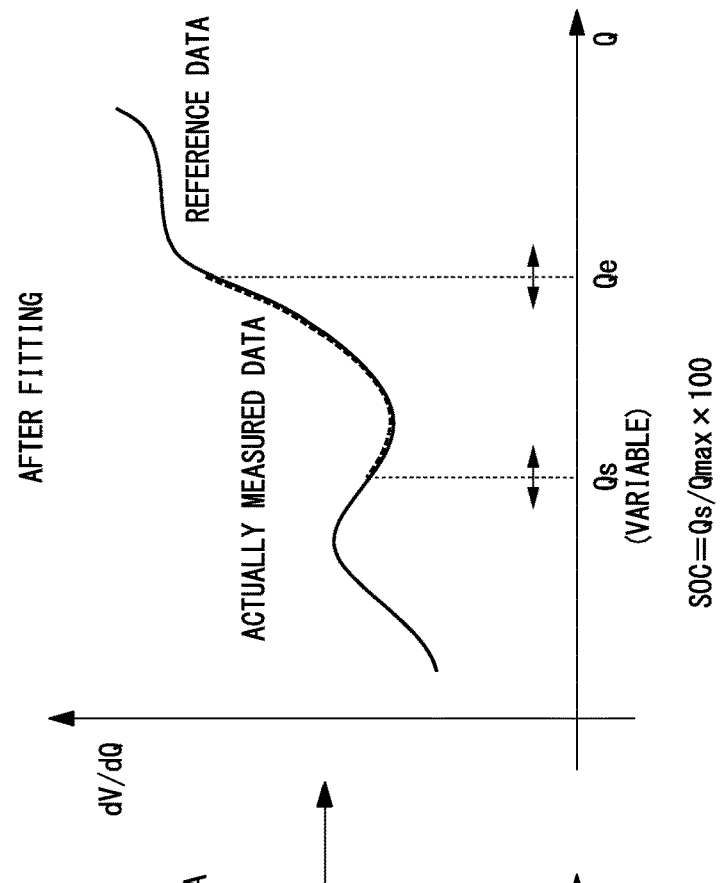
FIGS. 9A and 9B are drawings describing the processing for fitting a second partial derivative characteristic curve to the second reference derivative curve.
Figure 9B:
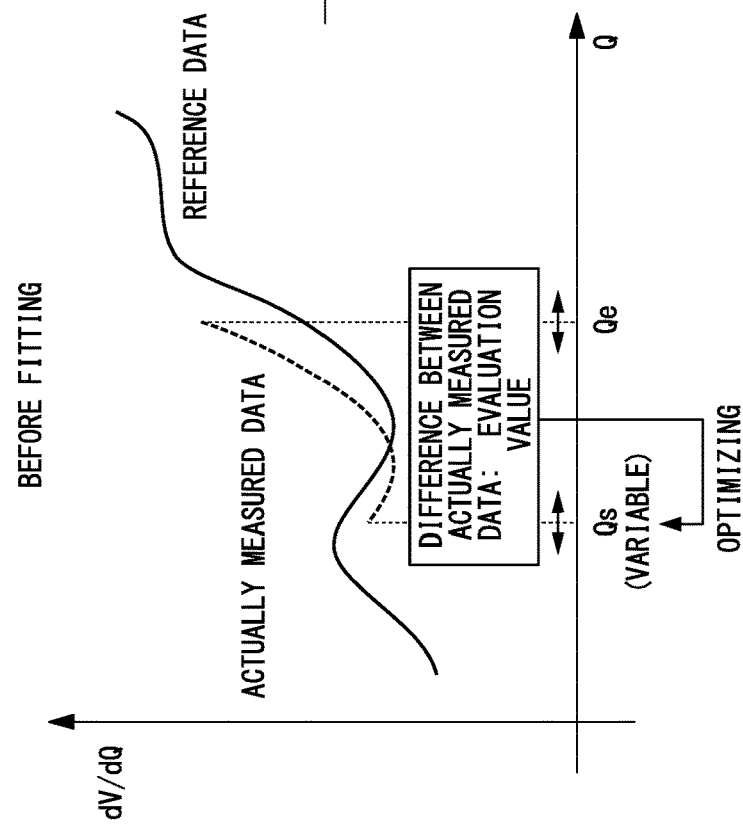

FIGS. 9A and 9B describe the processing to fit the second partial derivative characteristic curve to the second reference derivative curve. In each of FIG. 9A and FIG. 9B, the vertical axis represents the derivative value dV/dQ, and the horizontal axis represents the capacity Q.

FIG. 9A shows the correspondence before fitting between the second partial derivative characteristic curve, which is actually measured data at a prescribed time interval, and the second referend derivative curve as reference data. FIG. 9B shows the correspondence after fitting between the second partial derivative characteristic curve, which is actually measured data at a prescribed time interval, and the second referend derivative curve as reference data.

In the second partial derivative characteristic curve, which is actually measured data, error such as quantizing error occurring at the time of converting each of the voltage value V and the current value I to digital by A/D conversion are accumulated. For this reason, as shown in FIG. 9A, the second partial derivative characteristic curve exhibits parallel translation in the horizontal axis direction with respect to the second reference partial derivative characteristic curve as the reference data.

The shape of the second partial derivative characteristic curve does not, in the short term, change greatly with respect to the shape in a range of the capacity Q corresponding to the second reference derivative curve. Therefore, the second partial derivative characteristic curve is subjected to parallel translation in the horizontal axis direction with respect to the second reference derivative curve, and a range of the capacity Q that is similar to the shape of the second reference partial derivative characteristic curve is searched for in the shape of the second reference derivative curve.

By the fitting, which is the searching processing, the A/D conversion error is cancelled, and it is possible to optimize the range of the capacity Q of the second partial derivative characteristic curve. In FIG. 9, the capacity $Q_s$ is the value of the capacity Q at the start of the range in the second partial derivative characteristic curve, and the capacity $Q_e$ is the value of the capacity Q at the end of the range in the second partial derivative characteristic curve. With the capacity $Q_s$ as a variable, the capacity Q value is decreased or increased in prescribed change value ΔQ steps so as to minimize either the sum of the absolute value of the difference or the sum of the squares of the difference of the derivative value dV/dQ between the second partial derivative characteristic curve and the second reference derivative curve, the second partial derivative characteristic curve being subjected to parallel translation with respect to the horizontal axis and processing being performed to optimize the capacity $Q_s$, that is, to cancel the conversion error in the A/D conversion.

If, as shown in FIG. 9B, the result of the fitting processing is that a range of the capacity Q in the shape of the second reference derivative curve that is similar to the shape of the second partial derivative characteristic curve is obtained, the capacity $Q_s$ in this range of capacity Q in the second partial derivative characteristic curve is used in the computation of the SOC. As already discussed, the SOC determiner 154 divides the capacity $Q_s$ by the maximum capacity value $Q_{max}$ and multiplies the result of the division by 100 to compute the SOC.

The SOC determiner 154 transmits the determined SOC to the battery control system 4, which is the upstream control system. The SOC determiner 154 displays the determined SOC on a display device such as a display (not shown) provided in the secondary battery capacity measurement system 1.

Figure 10:
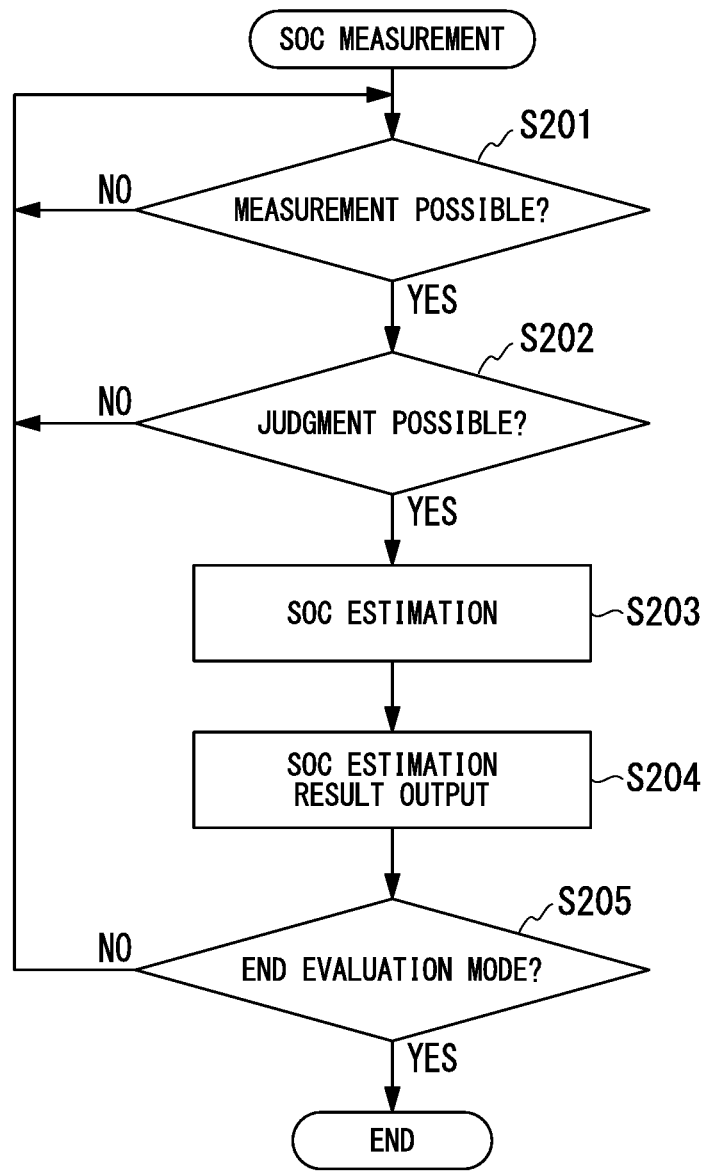
FIG. 10 is a flowchart showing an example of the operation in processing to estimate the SOC using the first partial derivative characteristic curve and the second partial derivative characteristic curve in the first embodiment.

FIG. 10 is a flowchart showing an example of the operation of the operation in processing to estimate the SOC using the first partial derivative characteristic curve and the second partial derivative characteristic curve.

Step S201:

The SOC computation ability determiner 151 determines whether or not a control signal indicating the estimation ability has been supplied from the controller 17, that is, determines whether or not the number of measurement data enabling execution of SOC estimation has been satisfied.

When this is done, if the SOC estimation is determined by the SOC computation ability determiner 151 to be possible, processing proceeds to step S202, but if the judgment is that SOC estimation is not possible, the processing of step S201 is repeated.

Step S202:

The SOC computation ability determiner 151 reads the derivative value dQ/dV and the voltage value V over a prescribed range from the measurement data storage 19-2 and generates a first partial derivative characteristic curve.

The SOC computation ability determiner 151 extracts the maximum value $(dQ/dV)_{max}$ of the derivative value dQ/dV in the first partial derivative characteristic curve.

Then, the SOC computation ability determiner 151 determines whether or not the extracted maximum value $(dQ/dV)_{max}$ is less than the first threshold.

When this is done, if the SOC computation ability determiner 151 determines that the maximum value $(dQ/dV)_{max}$ is less than the first threshold, because the SOC estimation is possible, processing proceeds to step S203.

If, however, the SOC computation ability determiner 151 determines that the maximum value $(dQ/dV)_{max}$ is equal to or greater than the first threshold, because the SOC estimation is not possible (because it is a range of the capacity Q of a derivative value dQ/dV not suitable for SOC estimation), processing proceeds to step S201.

Step S203:

The SOC error computer 152 reads out the derivative value dV/dQ and the capacity Q over a prescribed range from the measurement data storage 19-2 and generates the second partial derivative characteristic curve.

The SOC error computer 152 also reads out the second reference derivative curve from the characteristic data storage 19-1.

The SOC error computer 152 also computes the difference of the derivative values dV/dQ between the second reference derivative curve and the second partial derivative characteristic curve at each capacity value in the range of the capacity Q of the second partial derivative characteristic curve.

Next, the SOC optimization processor 153 subjects the second partial derivative characteristic curve to parallel translation with respect to the horizontal axis as shown at FIG. 9A, so as to minimize the absolute value of the difference of the derivative value dV/dQ determined by the SOC error computer 152.

In this case, each of the SOC error computer 152 and the SOC optimization processor 153 computes the difference of the derivative value dV/dQ and perform optimization processing by repeating the parallel translation of the second partial derivative characteristic curve.

The SOC optimization processor 153 ends the optimization processing at the point at which the absolute value of the difference of the derivative value dV/dQ determined by the SOC error computer 152 is minimized.

The SOC determiner 154 extracts as the capacity value for determining the SOC the capacity $Q_s$ that is the minimum value of the capacity Q in the range of the capacity Q of the second partial derivative characteristic curve optimized as shown at FIG. 9B.

The SOC determiner 154 reads out the maximum capacity $Q_{max}$ from the estimated value storage 19-3, divides the capacity $Q_s$ by the maximum capacity $Q_{max}$ and computes the SOC.

Step S204:

The SOC determiner 154, in addition to writing and storing the determined SOC into the estimated value storage 19-3, transmits it to the battery control system 4 that is the upstream control system. The SOC determiner 154 displays the estimated SOC on the display device, such as a display, of the secondary battery capacity measurement system 1.

Step S205:

The SOC computer 15 determines whether or not to end the evaluation mode that estimates the SOC, that is, detects whether or not a control signal that ends the estimation has been supplied from the controller 17.

When this is done, if the SOC computer 15 determines that the control signal that ends the estimation is not supplied from the controller 17, rather than ending the evaluation mode, processing proceeds to step S201. If, however, the judgment is that the control signal that ends the estimation has been supplied from the controller 17, the evaluation mode is ended.

(Maximum Capacity $Q_{max}$ Estimation)

The processing to estimate the maximum capacity $Q_{max}$ in the embodiments of the present invention will be described below, with references made to FIG. 3 and FIG. 5. The maximum capacity computation ability determiner 161 reads out a data group for a prescribed time range of a data set indicating the correspondence between the derivative value dQ/dV and the voltage value V from the measurement data storage 19-2 and generates the first partial derivative characteristic curve from that data group. Then, the maximum capacity computation ability determiner 161 determines whether or not the first partial derivative characteristic curve can be used to estimate the maximum capacity $Q_{max}$ of the SOC.

That is, the maximum capacity computation ability determiner 161 compares the first threshold of the derivative value dQ/dV that had been set beforehand with the maximum value of the derivative value dQ/dV in the first partial derivative characteristic curve. In this case, if the maximum value of the derivative value dQ/dV is equal to or greater than the first threshold in the first actually measured region, the maximum capacity computation ability determiner 161 determines that, the region being one in which, because the absolute amount of the change with respect to deterioration is great the contribution to the maximum capacity is also great, so that it is possible to estimate the maximum capacity $Q_{max}$ (first maximum capacity $Q_{max}$ computation ability judgment condition). If, however, the maximum value of the derivative value dQ/dV is less than the first threshold in the first actually measured region, the maximum capacity computation ability determiner 161 determines that, the region being one in which, because the absolute amount of the change with respect to the deterioration is small the contribution to the maximum capacity is also small, so that it is impossible to estimate the maximum capacity $Q_{max}$.

The maximum capacity computation ability determiner 161 uses the voltage value V and capacity Q used in computing the first partial derivative characteristic curve and generates the second partial derivative characteristic curve indicating the correspondence between the derivative value dV/dQ and the capacity Q. If the difference value between the maximum value $(dV/dQ)_{max}$ and the minimum value $(dV/dQ)_{min}$ in the derivative value dV/dQ of the second partial derivative characteristic curve exceeds the second threshold that has been established beforehand, the maximum capacity computation ability determiner 161 determines that the change of the derivative value dV/dQ is large with respect to the capacity Q, and that this is a region in which the characteristics are prominent.

For this reason, as a condition when the maximum capacity computation ability determiner 161 determines that it is possible to compute the maximum capacity $Q_{max}$, the condition may be added of whether or not the difference value between the maximum value $(dV/dQ)_{max}$ and the minimum value $(dV/dQ)_{min}$ in the region of the second partial derivative characteristic curve exceeds a pre-established second threshold (second maximum capacity $Q_{max}$ computation ability judgment condition).

The maximum capacity computation ability determiner 161, as shown in FIG. 8, extracts the maximum value $(dV/dQ)_{max}$ and the minimum value $(dV/dQ)_{min}$ in the region (actually measured Q region) of the second partial derivative characteristic curve. The maximum capacity computation ability determiner 161 then computes the difference value between the extracted maximum value $(dV/dQ)_{max}$ and minimum value $(dV/dQ)_{min}$. The maximum capacity computation ability determiner 161 determines whether or not the computed difference value exceeds the second threshold.

The maximum capacity error computer 162 reads out the second reference curve stored in the characteristic data storage 19-1. The maximum capacity error computer 162 then determines the difference (evaluation value B) of the difference in the derivative value dV/dQ at the same capacity Q in the second partial derivative characteristic curve and the second reference derivative curve in the region corresponding to the region of the capacity Q in the second partial derivative characteristic curve. This evaluation value B is, for example, determined by the maximum capacity error computer 162 as the sum of the squares of the difference of the above-noted derivative value dV/dQ.

The maximum capacity optimization processor 163 makes the reference derivative curve reconstructor 164, to be described later, correct the first reference derivative curve and the second reference derivative curve with until the above-described evaluation value B is minimized.

The reference derivative curve reconstructor 164 corrects the separated waveform derivative curves of the first reference derivative curve and the second reference derivative curve stored in the characteristic data storage 19-1 by the first partial derivative characteristic curve and the second partial derivative characteristic curve, respectively.

The reference derivative curve reconstructor 164 varies the parameters of functions representing each of the separated waveform curves derived from the positive electrode and the negative electrode by the separated waveform model and reconstructs a synthesized reference derivative curve (first reference derivative curve and second reference derivative curve) of the separated waveforms.

As the reconstruction processing, for example, there are the following three processing types, the first reconstruction processing, the second reconstruction processing, and the third reconstruction processing.

First Reconstruction Processing

The reference derivative curve reconstructor 164 changes in the first reference derivative curve the parameters of the separated waveform curves derived from each of the positive electrode and the negative electrode, makes adjustment so that the peak positions, peak widths, and peak heights (derivative value dQ/dV) in the separated waveform curves match the shape of the actually measured first partial derivative characteristic curve, and changes the shape of the separated waveform curves derived from each of the positive electrode and the negative electrode. In this case, the reference derivative curve reconstructor 164 changes the shape of the separated waveform curves derived from the positive electrode and the negative electrode so that the evaluation value A (or the sum of the squares of the difference), in which the absolute values of the differences for each of voltage value V corresponding to the first partial derivative characteristic curve (actually measured region) and the first reference derivative curve are added, is minimized.

The reference derivative curve reconstructor 164 synthesizes the changed separated waveform curves to generate a new first reference derivative curve. The reference derivative curve reconstructor 164 generates the second reference derivative curve from the generated new first reference derivative curve. The reference derivative curve reconstructor 164 acquires the evaluation value B, which is the sum of the squares of the difference of the derivative value dV/dQ for the same capacity Q in the second partial derivative characteristic curve, which is the actually measured part, and the second reference partial derivative characteristic curve.

In this case, the reference derivative curve reconstructor 164 changes the parameters of each of the separated waveform curves derived from the positive electrode and the negative electrode of the first reference derivative curve, until the evaluation value B, which is the sum of the squares of the difference of the derivative value dV/dQ in the second partial derivative characteristic curve and the second reference derivative curve in the range corresponding to the capacity Q of that second partial derivative characteristic curve is minimized.

Then, when the evaluation value B in the second partial derivative characteristic curve and the second reference derivative curve in the range of the capacity Q of the second partial derivative characteristic curve and the evaluation value A in the first partial derivative characteristic curve and the first reference derivative curve in the range of the capacity Q of the first partial derivative characteristic curve are minimized, the reference derivative curve reconstructor 164 ends the processing to reconstruct the first reference derivative curve and the second reference derivative curve.

Second Reconstruction Processing

The processing to reconstruct the first reference derivative curve and the second reference derivative curve may be performed as another reconstruction algorithm.

The maximum capacity optimization processor 163 subjects the second partial derivative characteristic curve to parallel translation by a pre-established change value of ΔQ of the capacity Q with respect to the horizontal axis, in the direction that makes the above-described evaluation value B smaller. As a result, the value of the capacity Q corresponding to each derivative values of the regions of the second partial derivative characteristic curve are changed.

The maximum capacity error computer 162, in the second partial derivative characteristic curve subjected to parallel translation and the second reference derivative curve in the regions corresponding to the regions of the capacity Q of the second partial derivative characteristic curve, again computes the evaluation value B, which is the sum of the squares of the difference of the derivative value dV/dQ in the same capacity Q.

In this case, the maximum capacity optimization processor 163 detects the position of the capacity Q for which the evaluation value B is minimized that is computed by the maximum capacity error computer 162, while subjecting the second partial derivative characteristic curve to parallel translation with respect to the horizontal axis. That is, the maximum capacity optimization processor 163 performs optimization by fitting processing of the second partial derivative characteristic curve with respect to the second reference derivative curve and detects the range of the curve shape of the capacity Q in the second reference derivative curve that is similar to the curve shape of the second partial derivative characteristic curve.

After that, the reference derivative curve reconstructor 164 corrects each of the first reference derivative curve and the second reference derivative curve stored in the characteristic data storage 19-1 by the first partial derivative characteristic curve and the second partial derivative characteristic curve, respectively.

The reference derivative curve reconstructor 164 changes the parameters of functions representing the separated waveform curves derived from each of the positive electrode and the negative electrode by the separated waveform model, and reconstructs the synthesized reference derivative curve (first reference derivative curve and second reference derivative curve) of the separated waveform curves.

As already discussed, the reference derivative curve reconstructor 164, when reconstructing the reference derivative curve, changes the parameters of the separated waveform curves derived from each of the positive electrode and the negative electrode, adjusts the peak positions, peak widths, and peak heights (derivative value dQ/dV) in the separated waveform curves, and changes the shape of the separated waveform curves derived from each of the positive electrode and the negative electrode. In this case, the reference derivative curve reconstructor 164 changes the shape of the separated waveform curves derived from the positive electrode and the negative electrode so that the evaluation value A (or the sum of the squares of the difference), in which the absolute values of the differences corresponding to each of the voltage V of the first partial derivative characteristic curve (actually measured region) and the first reference derivative curve are added, is minimized.

The reference derivative curve reconstructor 164 then synthesizes the changed separated waveform curves and generates a new first reference derivative curve. The reference derivative curve reconstructor 164 generates the second reference derivative curve from the generated new first reference derivative curve. The reference derivative curve reconstructor 164 acquires the evaluation value B in the second partial derivative characteristic curve in which the value of the capacity Q has been subjected to parallel translation to be optimized and the second reference derivative curve.

In this case, the reference derivative curve reconstructor 164 repeats processing to change the parameters of the separated waveforms derived from each of the positive electrode and the negative electrode of the first reference derivative curve and to generate a new first reference derivative curve, so that the evaluation value B in the second partial derivative characteristic curve and in the second reference derivative curve in the capacity Q range of the second partial derivative characteristic curve are minimized. Then, the reference derivative curve reconstructor 164 ends the processing to reconstruct the first reference derivative curve when the evaluation value B in the second partial derivative characteristic curve and in the second reference derivative curve in the capacity Q range of the second partial derivative characteristic curve and the evaluation value A in the first partial derivative characteristic curve and in the first reference derivative curve in the capacity Q range of the first partial derivative characteristic curve are minimized.

Third Reconstruction Processing

The processing to reconstruct the first reference derivative curve and the second reference curve may be performed as another reconstruction algorithm.

The reference derivative curve reconstructor 164 repeats processing that adjusts the peak positions, peak widths, and peak heights (derivative value dQ/dV) that are parameters of the separated waveform curves derived from the positive electrode and the negative electrode and generates a new first reference derivative curve, until the evaluation value A, which is the sum of the squares of the differences between the derivative value dQ/dV in the first partial derivative characteristic curve and the first reference derivative curve in the range corresponding to the voltage V in the first reference partial derivative characteristic curve.

Then, the reference derivative curve reconstructor 164 converts the determined new first reference derivative curve to the second reference derivative curve to obtain the new second reference derivative curve.

The maximum capacity determiner 165, using any of the three processing types described above, integrates the derivative value dQ/dV in the range of use (actually used range) of the voltage value V of the battery in the reconstructed first reference derivative curve and takes the result of that integration to be the maximum capacity $Q_{max}$ of the battery. The maximum capacity determiner 165 then writes and stores into the estimated value storage 19-3 the determined maximum capacity $Q_{max}$.

The maximum capacity determiner 165 also transmits the determined maximum capacity $Q_{max}$ to the battery control system 4, which is the upstream control system. The maximum capacity determiner 165 displays the determined maximum capacity $Q_{max}$ on a display device, such as a display (not shown) of the secondary battery capacity measurement system 1.

Figure 11:
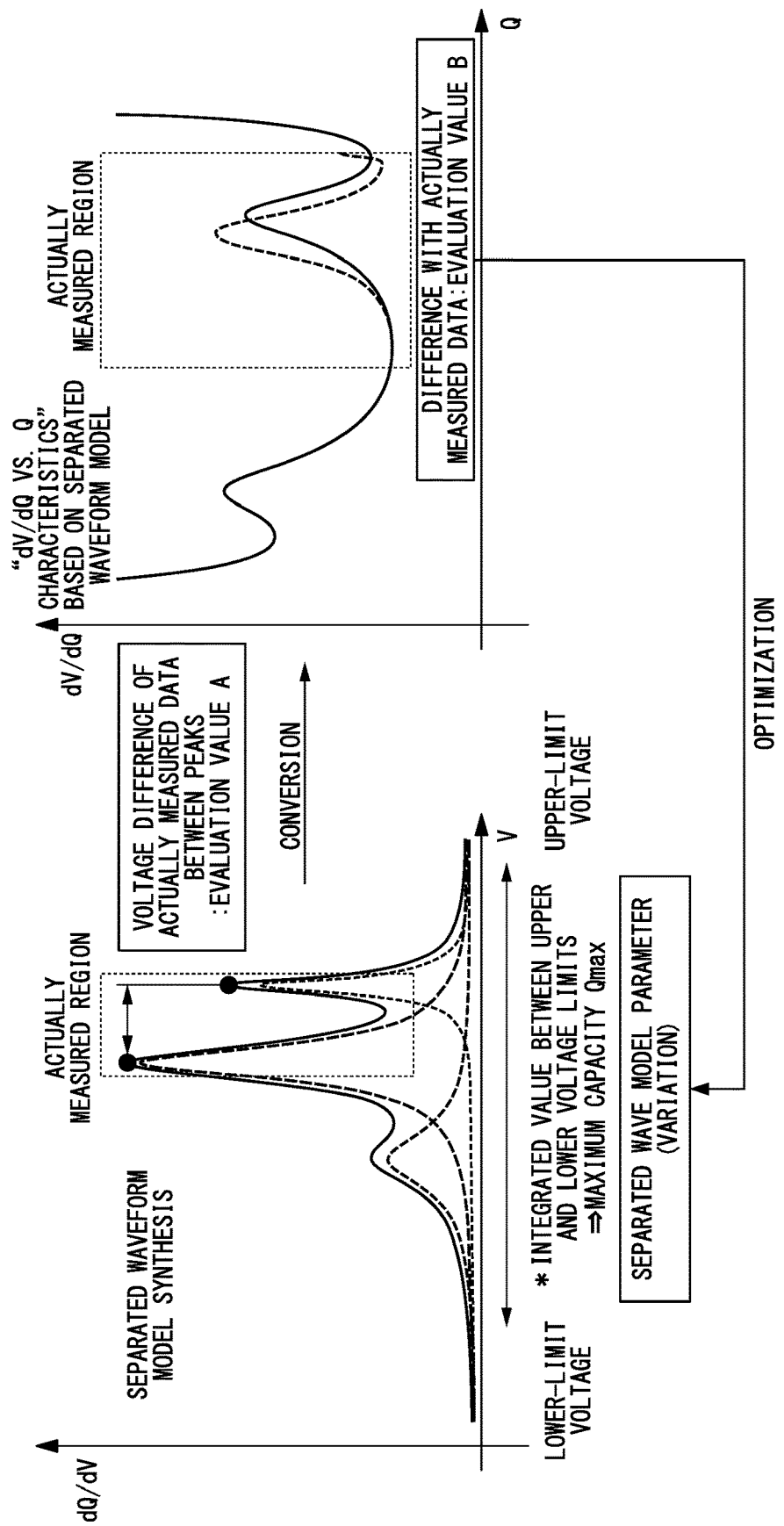
FIGS. 11A and B are drawings describing the reconstruction of the first reference derivative curve by a reference derivative curve reconstructor 164.

FIGS. 11A and 11B describe the reconstruction of the first reference derivative curve by the reference derivative curve reconstructor 164.

In FIG. 11A, the vertical axis represents the derivative value dQ/dV and the horizontal axis represents the voltage value V. FIG. 11A shows the adjustment of the parameters of the separated waveform curves derived from the positive electrode and the negative electrode constituting the first reference derivative curve, and the changing of the peak widths, peak heights, and peak positions in the synthesized first reference derivative curve, so as to resemble the shape of the first partial derivative characteristic curve of the actually measured data. In this case, parameters, such as the peak heights, peak positions, and the like of the function constituting each of the separated waveform curves derived from the positive electrode and the negative electrode, are adjusted so as to change the peak height and peak positions of the separated waveform curves.

In FIG. 11B, the vertical axis represents the derivative value dV/dQ and the horizontal axis represents the capacity Q. FIG. 11B shows that the first reference derivative curve is converted to the second reference derivative curve and that the difference in the derivative value dV/dQ between the actually measured second partial derivative characteristic curve and the second reference derivative curve in the capacity Q range of that second partial derivative characteristic curve is obtained as the evaluation value.

As shown in FIG. 11A, the shape of the second partial derivative characteristic curve is optimized so as to minimize the evaluation value B, that is, so that it resembles the shape of the second reference derivative curve. The optimization performs fitting processing repeatedly to adjust the parameters of the functions constituting the separated waveform curves derived from the positive electrode and the negative electrode, to change the peak height and peak positions of the separated waveform curves, to synthesize the separated waveform curves derived from the positive electrode and the negative electrode, to generate the first reference derivative curve, to change to the second reference derivative curve, and to minimize the evaluation value B with respect to the second partial derivative characteristic curve. At the point at which the shape of the second partial derivative characteristic curve best resembles the shape of the second reference derivative curve, the fitting processing is ended, at which ending point the first reference derivative curve is updated and is used as the first reference derivative curve that reflects the influence of battery deterioration.

Figure 12:
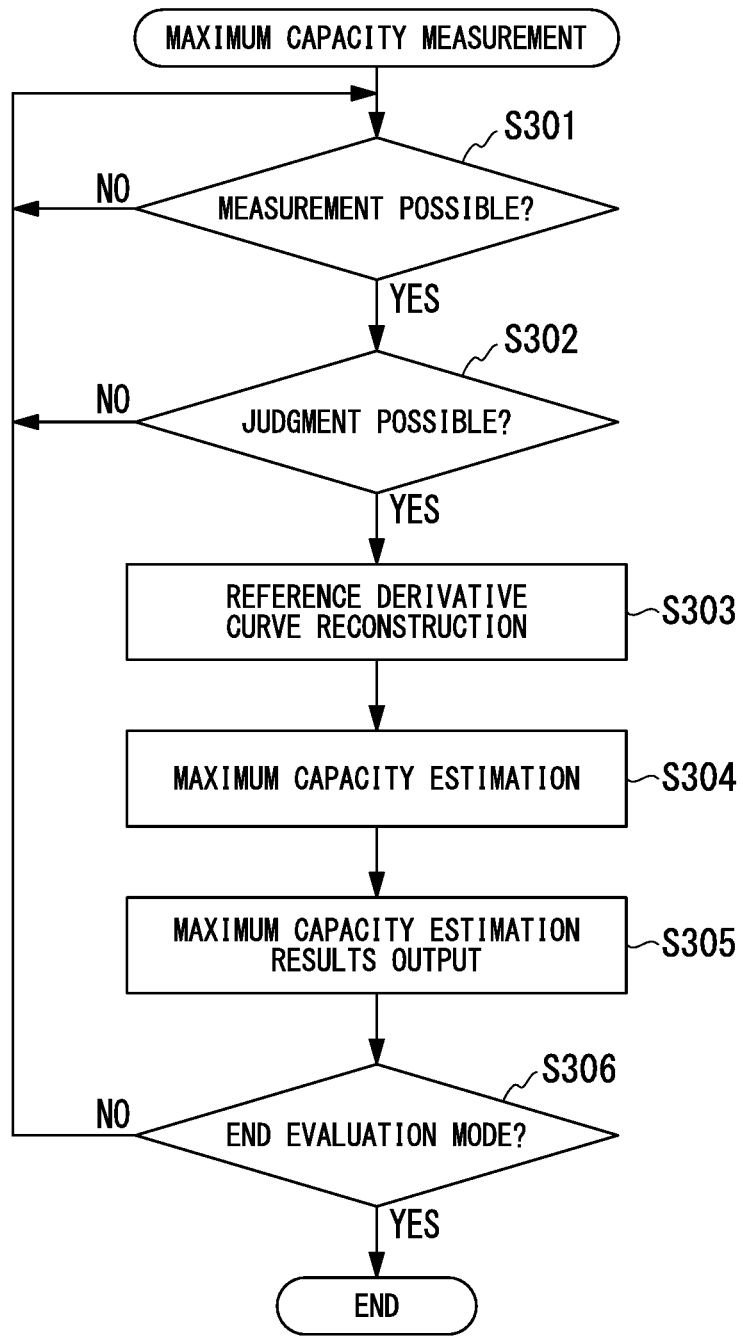
FIG. 12 is a flowchart showing an example of the operation in processing to estimate the maximum capacity $Q_{max}$ using the first partial derivative characteristic curve and the second partial derivative characteristic curve.

FIG. 12 is a flowchart showing an example of the operation of processing to estimate the maximum capacity $Q_{max}$ using the first partial derivative characteristic curve and the second partial derivative characteristic curve.

Step S301:

The maximum capacity computation ability determiner 161 determines whether or not a control signal indicating that estimation is possible has been supplied from the controller 17, that is, whether or not a number of actually measured data enabling execution of estimation of the maximum capacity $Q_{max}$ has been satisfied.

When this is done, if the maximum capacity computation ability determiner 161 determines that the execution of the estimation of the maximum capacity $Q_{max}$ is possible, the processing proceeds to step S302. However, if execution of the estimation of the maximum capacity $Q_{max}$ is not possible, the processing of step S301 is repeated.

Step S302:

The maximum capacity computation ability determiner 161 reads out the derivative value dQ/dV and the voltage value V over a prescribed range from the actually measured data storage 19-2 and generates the first partial derivative characteristic curve.

The maximum capacity computation ability determiner 161 extracts the maximum value $(dQ/dV)_{max}$ of the derivative value dQ/dV in the first partial derivative characteristic curve.

Then the maximum capacity computation ability determiner 161 determines whether or not the extracted maximum value $(dQ/dV)_{max}$ is equal to or greater than the first threshold.

When this is done, if the maximum capacity computation ability determiner 161 determines that the maximum value $(dQ/dV)_{max}$ is equal to or greater than the first threshold, because the maximum capacity $Q_{max}$ can be estimated, processing proceeds to step S303.

If, however, the maximum capacity computation ability determiner 161 determines that the maximum value $(dQ/dV)_{max}$ is less than the first threshold, because the maximum capacity $Q_{max}$ cannot be estimated, processing proceeds to step S301.

Step S303:

The maximum capacity error computer 162 reads out the derivative value dV/dQ and the capacity Q over a prescribed range from the actually measured data storage 19-2 and generates the second partial derivative characteristic curve. The maximum capacity error computer 162 reads out the second reference derivative curve from the characteristic data storage 19-1.

Then, the maximum capacity error computer 162 computes the evaluation value A between the first reference derivative curve and the first partial derivative characteristic curve.

The maximum capacity error computer 162 computes the evaluation value B of the derivative value dV/dQ between the second reference derivative curve and the second partial derivative characteristic curve from each of the capacity values over the range of capacity Q (from the capacity $Q_s$ to the capacity $Q_e$) of the second partial derivative characteristic curve.

The maximum capacity optimization processor 163 causes the reference derivative curve reconstructor 164 to repeatedly change the parameters of separated waveform curves derived from the positive electrode and the negative electrode of the first reference derivative curve, and to generate a new first reference derivative curve until the evaluation value B, in which the absolute values of the differences of the derivative value dV/dQ in the second reference derivative curve of the capacity Q range of the second partial derivative characteristic curve is minimized.

In this case, each of the maximum capacity error computer 162 and the maximum capacity optimization processor 163 repeats optimization processing to compute the derivative value dV/dQ difference evaluation value and peak position difference evaluation value B, and to cause the reference derivative curve reconstructor 164 to generate a new first reference derivative curve until the evaluation value B is minimized. Basically, in the optimization processing, the reference derivative curve reconstructor 164 ends the optimization processing at the point at which both the evaluation value B in the second partial derivative characteristic curve and the second reference derivative curve in the capacity Q range of the second partial derivative characteristic curve and the evaluation value A in the first partial derivative characteristic curve and the first reference derivative curve in the capacity Q range of the first partial derivative characteristic curve are minimized.

That is, in the optimization processing, the reference derivative curve reconstructor 164 repeatedly performs processing to change the parameters of the functions constituting the separated waveform curves derived from the positive electrode and the negative electrode in the first reference derivative curve and to generate a new first reference derivative curve, so that the evaluation value of the derivative value dV/dQ in the second partial derivative characteristic curve and the second reference derivative curve in the capacity Q range of the second partial derivative characteristic curve is minimized. In this case, the reference derivative curve reconstructor 164 corrects the separated waveform curves derived from the positive electrode and the negative electrode of the first reference derivative curve so that the evaluation value A in the first partial derivative characteristic curve and the first reference derivative curve in the capacity Q range in the first partial derivative characteristic curve is minimized.

The maximum capacity optimization processor 163 takes the first reference derivative curve, for which the evaluation value B by the difference between the derivative value dV/dQ between the second partial derivative characteristic curve and the second reference derivative curve is minimized, to be the reconstructed first reference derivative curve.

Step S304:

The maximum capacity determiner 165 integrates the derivative value dQ/dV in the range of usage of the battery voltage value V in the reconstructed first reference derivative curve.

The maximum capacity determiner 165 takes the value of capacity obtained as the result of the integration to be the maximum capacity $Q_{max}$ of the battery.

Step S305:

The maximum capacity determiner 165 writes and stores into the estimated value storage 19-3 the maximum capacity $Q_{max}$ obtained from the above-described integration.

The maximum capacity determiner 165 transmits the determined maximum capacity $Q_{max}$ to the battery control system 4 and the SOC re-estimator 155 and causes it to be displayed on a display device of the secondary battery capacity measurement system 1.

Step S306:

The maximum capacity computer 16 determines whether or not to end the evaluation mode in which the maximum capacity $Q_{max}$ is estimated, that is, it detects whether a control signal ending the estimation has been supplied from the controller 17.

When this is done, if the maximum capacity computer 16 determines that the control signal ending the estimation has not been supplied from the controller 17, processing proceeds to step S301 without ending the evaluation processing. If, however, the maximum capacity computer 16 determines that the control signal ending the estimation has been supplied from the controller 17, it ends the evaluation mode.

It is known that, because the energy level at a low-potential negative electrode is high, for example, in the case of a lithium-ion secondary battery, the Li (lithium) inserted into the active substance and the lithium in the electrolyte undergo a side reaction at the surface of the negative electrode active substance, facilitating the growth of an SEI (solid electrolyte interface) film, precipitation of metallic Li, and the generation of LiF (lithium fluoride).

For this reason, if the lithium inserted into the negative electrode active substance is used in this side reaction, the true SOC of the negative electrode changes, and there is an imbalance between the positive electrode and the negative electrode. This balance changes the spacing between the peaks of the separated waveform derivative curves derived from the positive electrode and the negative in the first reference derivative curve. For this reason, in the maximum capacity error computer 162, the difference between the peak spacing in the separated waveform derivative curves derived from the positive electrode and the negative electrode in the first partial derivative characteristic curve of actually measured data and the first reference derivative curve of the separated waveform model is optimized as the second evaluation value, thereby enabling optimization with a smaller difference in the maximum capacity optimization processor 163.

In terms of electrochemistry, it can be envisioned that the peak spacing in the separated waveform derivative curves derived from the same electrode will not change greatly even if there is deterioration. Considering this characteristic, by reconstructing the first reference derivative curve, it is possible to efficiently estimate the derivative curve with greater proximity to actually measured values.

Because the peak spacing in the separate waveform derivative curves derived from the same electrode as noted above are relative values, if the actually measured regions in each of the first partial derivative characteristic curve and the second partial derivative characteristic curve are set to regions in which the current value I is some arbitrary constant value, the voltage value V(=internal resistance R×current value I) in accordance with the internal resistance R of the battery that drops the output voltage of the battery is constant within that actually measured region. Therefore, according to the embodiments of the present invention, by making the voltage value V of the voltage drop constant in the above-noted output voltage of the battery in the actually measured region, because the influence of the voltage drop on the evaluation of the output voltage thereof is cancelled, it is easy to determine the peak spacing with high accuracy.

Even if the SEI film on the electrode surface grows by deterioration and the internal resistance R itself changes, because the peak spacing in the separate waveform derivative curves derived from the same electrode are relative values, if the actually measured regions in each of the first partial derivative characteristic curve and the second partial derivative characteristic curve are set to regions in which the current value I is some arbitrary constant value, the voltage value V (=internal resistance R×current value I) in accordance with the internal resistance R of the battery that drops the battery voltage is constant within that actually measured region. Therefore, according to the embodiments of the present invention, even if the internal resistance R itself changes, by cancelling the influence of the voltage drop on the evaluation of the output voltage of the battery in the actually measured region, the influence of the voltage drop on the measurement of the peak position is eliminated, and it is easy to determine the peak spacing with high accuracy.

When a battery deteriorates, the capacity is reduced by deactivation and isolation of the active substance in the positive electrode and negative electrode. When this occurs, in the "dQ/dV vs. V characteristics, the surface area of the peak derived from the positive electrode commensurate with the decrease in the capacity attributed to the positive electrode is reduced (reduction in the strength of the peak), and the surface area of the peak derived from the negative electrode commensurate with the decrease in the capacity attributed to the negative electrode is reduced (reduction in the strength of the peak). For example, in the case of a graphite negative electrode, a plurality of peaks exists because of phase transition and the condition of a decrease in the peak strength by deterioration of each thereof can be envisioned as being different because of, for example, operating conditions and history. In the present invention, because optimization is done by providing variable that adjust the peak strengths individually for each of the separated waveforms derived from peaks of each of the electrodes and phase transition, it is possible to accommodate diverse deterioration modes.

(SOC Re-Estimation)

The SOC re-estimator 155, as already described, re-estimates the SOC upon supply of an updating signal from the maximum capacity computer 16 indicating that the maximum capacity $Q_{max}$ has been updated.

That is, if the mode to re-estimate is set, after the point at which the immediately previous SOC estimation is done, when a new maximum capacity $Q_{max}$ is measured, the SOC re-estimator 155 re-estimates the SOC in accordance with the flowchart shown in FIG. 10. In this case, the SOC re-estimator 155 re-estimates the SOC using the second partial derivative characteristic curve used in the immediately previous SOC estimation.

Figure 13:
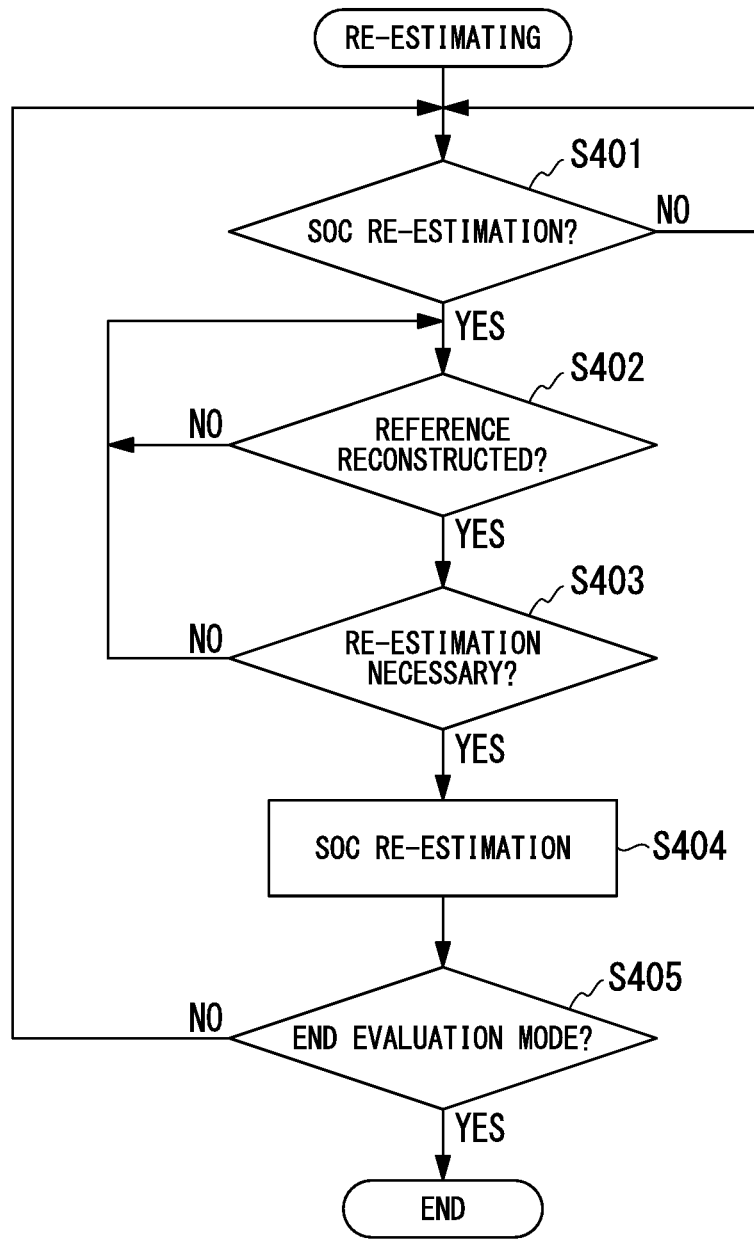
FIG. 13 is a flowchart showing an example of the operation in processing to re-estimate the SOC using the first partial derivative characteristic curve and the second partial derivative characteristic curve.

FIG. 13 is a flowchart showing an example of the operation of processing the re-estimation of the SOC using the first partial derivative characteristic curve and the second partial derivative characteristic curve.

Step S401:

The SOC re-estimator 155 determines whether or not the SOC re-estimation mode that estimates the SOC has been set.

When this is done, if the SOC re-estimator 155 estimates that the SOC re-estimation mode is set, processing proceeds to step S401. If, however, it determines that the SOC re-estimation mode is not set, the processing of step S401 is repeated.

Step S402:

The SOC re-estimator 155 determines whether or not the reference derivative curve reconstructor 164 has reconstructed the first reference derivative curve.

In this case, for example, depending upon whether or not the reference derivative curve reconstructor 164 has transmitted a new maximum capacity $Q_{max}$ the SOC re-estimator 155 determines whether or not the first reference derivative curve is reconstructed. Alternatively, the SOC re-estimator 155 may verify the timestamp of the maximum capacity $Q_{max}$ stored in the estimated value storage 19-3 and, by whether or not the time is after the timestamp of the maximum capacity $Q_{max}$ used in the immediately previous SOC estimation, determine whether or not the first reference derivative curve has been reconstructed.

When this is done, if the judgment by the SOC re-estimator 155 is that the first reference derivative curve was reconstructed, processing proceeds to step S403. If, however, the judgment is that the first reference derivative curve has not been reconstructed, processing proceeds to step S402.

Step S403:

The SOC re-estimator 155 determines the difference $\Delta Q$ between the maximum capacity $Q_{max}$ used in the immediately previous SOC estimation and the maximum capacity $Q_{max}$ newly transmitted from the reference derivative curve reconstructor 164, compares the difference $\Delta Q$ with a pre-established set value $\Delta Q_s$, and determines whether or not it is necessary to re-estimate the SOC.

That is, if the SOC re-estimator 155 determines that the difference $\Delta Q$ exceeds the set value $\Delta Q_s$, meaning that it is necessary to re-estimate the SOC, processing proceeds to step S404. If, however, the SOC re-estimator 155 determines that the difference $\Delta Q$ does not exceed the set value $\Delta Q_s$ (that is, the difference value $\Delta Q$ is at or lower than the set value $\Delta Q_s$), meaning that it is not necessary to re-estimate the SOC, processing proceeds to step S402.

Step S404:

The SOC re-estimator 155 performs the processing of steps S203 and S204 of FIG. 10 with respect to each of the SOC error computer 152, the SOC optimization processor 153 and the SOC determiner 154, that is, causes the re-estimation of the SOC. In this case, because the processing to re-estimate the SOC is the same as the operation described for the SOC estimation, the description thereof is omitted.

Step S405:

The SOC re-estimator 155 determines whether or not the evaluation mode that estimates the SOC is to be ended, that is, detects whether or not a control signal that ends the estimation has been supplied from the controller 17.

When this is done, if the SOC re-estimator 155 determines that the control signal ending the estimation has not been supplied form the controller 17, it does not end the evaluation mode and proceeds to step 401. If, however, the SOC re-estimator 155 determines that the control signal ending the estimation has been supplied from the controller 17, it ends the evaluation mode.

As described above, according to the embodiments of the present invention, a judgment regarding whether or not SOC estimation is possible is made by the first reference derivative curve (dQ/dV vs. V characteristics), which is the derivative characteristic curve synthesized from the separated waveform models, and the first partial derivative characteristic curve, which is actually measured data in a partial region. The second reference derivative curve (dV/dQ vs. Q characteristics) and the second partial derivative characteristic curve, which is actually measured data in a partial region are used to perform estimation of the SOC.

By doing this, according to the embodiments of the present invention, it is possible to perform estimation by the minimum amount of actually measured data in an arbitrary partial region that satisfies each of the computation ability judgment conditions. For this reason, according to the embodiments of the present invention, it is possible to estimate the SOC and the maximum capacity $Q_{max}$ of a battery in a relatively short time compared to the conventional method, without leaving the SOC region of normal operation of the battery. According to the embodiments of the present invention, because the SOC and the maximum capacity $Q_{max}$ of a battery can be estimated in the normal operating condition of the battery, it is possible to increase the operating efficiency of the power storage system compared to the conventional method.

According to the embodiments of the present invention, because of using the relative change amount of the voltage value V and capacity Q in the actually measured region as the evaluation value, if the actual measurement region of the actually measured data of the voltage value V and the current value I is set to a fixed period of an arbitrary time, it is possible to ignore the change of the absolute value of the voltage value V caused by voltage drop.

According to the embodiments of the present invention, in the estimation of the SOC of the battery, even if there is accumulation of A/D conversion errors in the A/D convertor 11 that converts the current value I of the current sensor 21 and the voltage value V of the voltage sensor 3 when operating over a long period of time, because fitting is done of the second partial derivative characteristic curve with respect to the second reference derivative curve, that is, the range from the capacity $Q_s$ at the start of the measurement to the capacity $Q_e$ at the end of the measurement of the second partial derivative characteristic curve being made to coincide with the capacity Q range in the second reference derivative curve, and an absolute evaluation is done of the capacity Q in the second partial derivative characteristic curve with respect to the second reference derivative curve, it is possible to estimate the SOC with high accuracy without being subjected to the influence of A/D conversion error.

According to the embodiments of the present invention, because each of the SOC estimation and the maximum capacity $Q_{max}$ estimation are driven as independent functions, it is possible to estimate the SOC and the maximum capacity separately in the minimum time.

In the embodiments of the present invention, by the change of the maximum capacity $Q_{max}$ caused by battery deterioration, the value of the SOC itself, by virtue of the definition of the SOC (capacity Q/maximum capacity $Q_{max}$), so that it is possible to estimate the SOC with high accuracy, accommodating battery deterioration. Also, by the change of the separated waveform model that indicates the battery characteristics due to battery deterioration, the characteristics of the characteristics derivative curve that is the synthesis of each of the separated waveform curves derived from the positive electrode and the negative electrode (the first reference derivative curve and the second reference derivative curve) also change. By the change of the characteristic derivative curve caused by deterioration, the value of the maximum capacity $Q_{max}$ also changes, and the maximum capacity $Q_{max}$ influences the error in the estimation to the SOC.

For the reasons described above, if the estimated value of the maximum capacity $Q_{max}$ changes greatly from the previous time, there is a possibility that the currently displayed SOC includes an estimation error caused by the change in the maximum capacity $Q_{max}$. For this reason, in the embodiments of the present invention, when estimating the maximum capacity $Q_{max}$, there is a function that, after optimizing the parameters of the separated waveform derivative curves of the separated waveform model, reconstructs the characteristic derivative curves (first reference derivative curve and second reference derivative curve). By virtue of this constitution, it is possible to provide the latest characteristic derivative curves (first reference derivative curve and second reference derivative curve) that reflect the deterioration of the battery with the elapsed of time.

As a result, in the embodiments of the present invention, by re-estimating the SOC by returning to the point of the immediately previous SOC estimation and using the latest characteristic derivative curves (first reference derivative curve and second reference derivative curve), it is possible to estimate the SOC of the battery with a high accuracy compared to the conventional method, even if the battery exhibits a significant degree of deterioration.

For example, in Japanese Patent Application Publication No. 2009-80093, the active substance-specific discharging curves for each the positive electrode and the negative electrode alone are actually measured, and a variable that represents the mass of the effective active substance of each is used and also a variable that corrects the positional relationship of the discharging curves is used to adjust the scale and the shape of the actually measured discharging curves. Then the each of the positive electrode and negative electrode discharging curves is synthesized and formulated, optimization is done of each of the above-noted variables so as to establish a correspondence between the formulated discharge curves and the actually measured values, and the maximum capacity is estimated.

However, in the above-noted conventional example, if the effective active substance mass is decreased because of deterioration, processing is performed to reduce the discharging curves in the horizontal axis direction by a uniform ratio, uniformly over the entire SOC region. If the "dQ/dV vs V characteristics" are considered, this processing corresponds to performing processing to reduce only the strength (dQ/dV) by a uniform ratio over the entire voltage region.

That is, it is known that in the "dQ/dV vs. V characteristics" representing the phase transition phenomenon of the crystals in the battery, because of the interaction of change in the rate of reaction and the change in the interaction between the reacting substances at the surface of the active substances, there is generally a change not only in the peak strengths, but also the peak positions, the peak half-value widths (sharpness), and the asymmetry. When the battery deteriorates, these changes, because of changes the active substance surface condition caused by, for example, changes in the structure of the active substances and side reactions, cause changes in the reaction rate, and the interaction between reacting substances.

If the battery deteriorates, the manner in which the strength (dQ/dV) changes by the deterioration is not limited to being uniform over the entire voltage range in the specifications of the storage battery. For this reason, by changing only the strength (dQ/dV) as done in the above-noted conventional example, it is not possible to sufficiently match to the actually measured values and, in order to improve the accuracy of estimating the maximum capacity, it is necessary to obtain and compare the actually measured data of the "dQ/dV vs. V characteristics" over a wide range. However, if actually measured data are obtained over a wide range, much time is required for evaluation, and there is a problem of a tradeoff, in which, if the range of the actually measured data is made narrow, because the manner in which the strength (dQ/dV) changes is not necessarily uniform over the entire voltage region as described above, the estimation error becomes large.

According to the embodiments of the present invention, because the separated waveform derivative curves for each of the positive electrode and negative electrode individually are formed to be approximated by functions corresponding to the peaks of each, parameters that change the peak heights, peak half-value widths (sharpnesses), the peak asymmetry, and the pack positions and the like of each peak of the functions constituting the separated waveform curves can be adjusted to change the peak heights, peak half-value widths (sharpnesses), the peak asymmetry, and the peak positions of the separated waveform curves, and the peaks corresponding to each of the functions can be finely adjusted and the first reference derivative curve can be generated. In this first reference derivative curve, it is possible, by integrating the derivative value dQ/dV with respect to the voltage value V over the range of used voltage V, to determine the maximum capacity $Q_{max}$, thereby enabling estimation of the maximum capacity $Q_{max}$ of the battery with a higher accuracy than a conventional example.

According to the embodiments of the present invention, because it is possible to independently adjust parameters of functions corresponding to each of the peaks of the first reference derivative curve and it is also possible to adjust to achieve some causal relationship based on an electrochemical basis, even if the degree of battery deterioration is not uniform depending on the voltage region, it is possible to form the first reference derivative curve.

Figure 14:
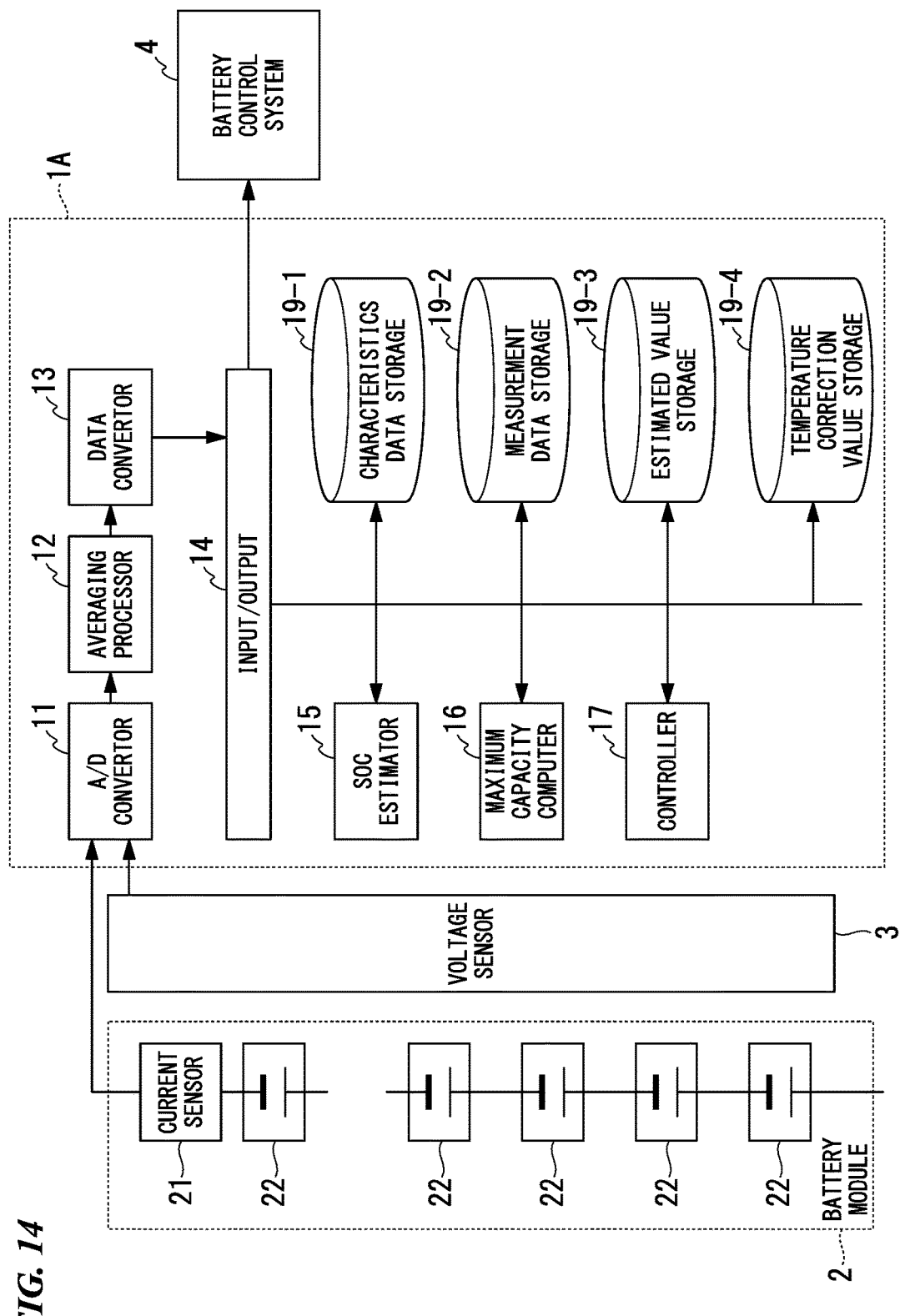
FIG. 14 is a drawing showing an example of the constitution of a secondary battery capacity measurement system according to a second embodiment of the present invention.

FIG. 14 shows an example of the constitution of a secondary battery capacity measurement system 1A according to the second embodiment of the present invention. Constituent elements that are the same as in the constitution of FIG. 3 are assigned the same reference symbols, and only constituent elements that are difference from those in FIG. 3 will be described below. The second embodiment shown in FIG. 14 is provided, in addition to the constitution of the second battery capacity measurement system of FIG. 3, a temperature correction value storage 19-4.

In the actual operating environment of a fixed installation power storage system, although there are cases in which the room temperature is controlled by air-conditioning, there are passive environments subjected to outside air, with drastic changes in temperature.

Even if the room temperature is controlled so as to be constant, heat generated internally by charging and discharging a battery may change the temperature of the battery.

In general, the derivative characteristics of a curve indicating the relationship of correspondence between the capacity Q and the voltage value V of the battery have been known to change with temperature. The cause of this is that the ease with which insertion reactions and elimination reactions of ions with respect to the active substance in the positive electrode and negative electrode of the battery changes with temperature, and the viscosity of the electrolyte within the battery changes with temperature, thereby causing a change in the ease of movement of ions between electrodes. Also, in the graphite or other materials used in the battery, which exhibit a plurality of phase transition phenomena, there are parts in which the sensitivity to battery characteristics with respect to phase transition phenomena with respect to temperature is large and parts in which the sensitivity thereto is small.

For this reason, in the second embodiment, the derivative characteristics of a curve representing the relationship of correspondence between the capacity Q and the voltage value V are obtained beforehand for a number of temperatures of the battery at the initial stage. Temperature correction values for the separated waveform derivative curves derived from each of the positive electrode and the negative electrode using a separated waveform model are generated and written and stored into the temperature correction value storage 19-4.

When this is done, from the change in the parameters with respect to the temperature regarding each of the separated waveforms, interpolation or the like can be done to determine and store temperature correction values beforehand for each of the separated waveform derivative curves.

Alternatively, the method of storing a separated waveform model for a number of temperatures as a map may be adopted. Also, the method of using a region with a small sensitivity with respect to temperature in the derivative characteristics of a curve representing the relationship of correspondence between the capacity Q and the voltage value V to estimate the DOC and the maximum capacity $Q_{max}$ may be adopted.

The second battery capacity measurement system according to the second embodiment has, for example, a temperature sensor (not shown). The temperature information output by the temperature sensor is supplied to the SOC computer 15 and the maximum capacity computer 16. Alternatively, the arrangement may be done in which temperature information is supplied from the outside to the SOC computer 15 and the maximum capacity computer 16.

When each of the SOC computer 15 and the maximum capacity computer 16 estimate the SOC and the maximum capacity $Q_{max}$, respectively, they read out from the characteristic data storage 19-1 the separated waveform derivative curves derived from the positive electrode and the negative electrode constituting the first reference derivative curve.

Each of the SOC computer 15 and the maximum capacity computer 16 read out from the temperature correction value storage 19-4 temperature correction values of each of the separated waveform derivative curves derived from the positive electrode and the negative electrode corresponding to the temperatures in the temperature information.

Each of the SOC computer 15 and the maximum capacity computer 16 correct the separated waveform derivative curve derived from the positive electrode and the negative electrode constituting the read out first reference derivative curve, using the correction value for each separated waveform derivative curve derived from the positive electrode and negative electrode corresponding to the temperatures in the temperature information.

Each of the SOC computer 15 and the maximum capacity computer 16 synthesize the separated waveform derivative curves derived from the positive electrode and the negative electrode that have been corrected and generate the first reference derivative curve. Because the subsequent processing is the same as in the already-described embodiment, it will be omitted.

By the above-described constitution, the second embodiment can estimate the SOC and the maximum capacity $Q_{max}$ with a high accuracy compared to the conventional estimation, even in an environment in which the battery temperature changes.

The above-described estimation of the SOC and estimation of the maximum capacity $Q_{max}$ may be performed with respect to the individual batteries 22 constituting the battery module 2, or may be performed collectively with respect to the batteries 22 constituting the battery module 2.

If estimation is performed with respect to the individual batteries 22, separated waveform derivative curve derived from the positive electrode and the negative electrode are prepared for each of the batteries 22, and the first reference derivative curves for each of the batteries 22 are written and stored beforehand into the characteristic data storage 19-1. In the case in which the estimation is performed collectively with respect to the batteries 22 constituting the battery module 2, the separated waveform derivative curves derived from the positive electrode and the negative electrode of the battery module 2 overall are prepared and the first reference derivative curve of the battery module 2 overall is written and stored into the characteristic data storage 19-1 beforehand.

(Quantification of the Positive Electrode and the Negative Electrode Deterioration)

The embodiments of the present invention are based on a separated waveform model indicating the phase transition phenomena of materials in the electrodes of the battery. Because of this, if the materials of the battery electrodes are clearly known from the start, by detecting beforehand whether each of the peaks in the first reference derivative curve is the separated waveform derivative curve derived from the positive electrode or the separated waveform derivative curve derived from the negative electrode, it is possible to associate each peak with either the positive electrode or the negative electrode.

For this reason, in the embodiments of the present invention, it is possible from the change of each separated waveform derivative curves with respect to the deterioration of the parameter values (parameter values of peaks) to estimate to some degree whether the deterioration is of the positive electrode or the negative electrode.

By, for example, developing a function of the trend in the change of the peaks, it may be possible to predict the deterioration.

FIG. 15 shows an example of a table indicating the quantification of the degree of deterioration of the positive electrode and the negative electrode of the battery. The table of FIG. 15 is, for example, written and stored into the measured data storage 19-2. The table of FIG. 15 will be described for the example case of the four peaks Peak1, Peak2, Peak3, and Peak4, of the first reference derivative curve.

The term "Origin" in the table is the item indicating either the peak is the separated waveform derivative curve derived from the positive electrode or is the separated waveform derivative curve derived from the negative electrode. In FIG. 15, Peak1 and Peak4 are peaks in the separated waveform derivative curve derived from the positive electrode, and Peak2 and Peak3 are peaks in the separated waveform derivative curve derived from the negative electrode.

Parameters are, for example, H, which indicates the peak strength value and W, which indicates the peak half-value width.

Each of Day1, Day2, and Day3 indicate the number of days that have elapsed from the start of operation, Day1 being after the elapse of 1 day, Day2 being after the elapse of 2 days, and Day3 being after the elapse of 3 days.

For each number of elapsed days, the change in the already-described parameters is written and stored.

In the example shown in FIG. 15, it is understood that, accompanying deterioration, the change in the parameter values for Peak2 and Peak3 of the separated waveform derivative curve derived from the negative electrode is smaller than for Peak1 and Peak4 of the separated waveform derivative curve derived from the positive electrode.

As described above, because Peak1 and Peak4 are peaks in the separated waveform derivative curve derived from the positive electrode, and Peak2 and Peak3 are peaks in the separated waveform derivative curve derived from the negative electrode, it can be estimated that, in this battery, the deterioration of the negative electrode has progressed more than the deterioration of the positive electrode.

This enables the embodiments of the present invention, using the table of FIG. 15, to estimate the deterioration trends in the positive electrode and the negative electrode of the battery, and to estimate the future change in the characteristics of the battery.

Next, a secondary battery capacity measurement system 1B in the third embodiment will be described. Before describing an example of the constitution of the third embodiment, the problems solved in the third embodiment will be described.

A battery uses an electrochemical reaction, and it is generally known that, depending upon the history of usage (how active substances within the battery have been made to react), the "dQ/dV vs. V characteristics", which are the partial derivative characteristic curves corresponding to the first reference derivative curve, will subsequently change. As an example, there is a memory effect in the "dQ/dV vs. V characteristics" of a battery. This memory effect is the phenomenon whereby, before the battery voltage decreases sufficiently, that is, in the state of some degree of remaining capacity (shallow depth of discharging), if discharging is stopped and then discharging is performed again, the voltage behavior exhibits a narrowing in the vicinity of stopping discharging at the first time so that the apparent remaining battery life is made to change.

Although there are various theories regarding the memory effect mechanism, it has been known that a refreshing operation for the prescribed amount of time to maintain the complete discharging (SOC 0%) or the complete charging (SOC 100%) solves the memory effect problem. Additionally, the longer is the above maintenance time, the more prominent the effect of refreshing appears. This memory effect occurs prominently in NiCd batteries and nickel hydrogen batteries, but has recently come to be recognized as existing, although not prominently, in lithium ion batteries as well (for example, T. Sasaki, et al, Nature Materials 12, 569-575 (2013)).

In the estimation of the state of a second battery by comparing the derivative characteristics and actually measured values of the charging and discharging curves, it is seen as being desired to evaluate using data for charging and discharging at a low rate. In general, because charging and discharging at a low rate results in the reliable progress of insertion and elimination phenomena with respect to the active substances in a lithium ion battery, based on phase transition phenomena and also results in small dynamic effects such as the diffusion of substances within the battery, it is possible to clearly grasp the "change in potential (V) derived from phase transition reactions" within the battery, which are important in OC estimation and maximum capacity estimation. In a method such as this for grasping the characteristics of the change in potential (V) in this manner, the change in the voltage behavior caused by the memory effect greatly influences the results of SOC estimation or maximum capacity Q estimation. For this reason, when using a secondary battery having a memory effect, when estimating the SOC or the maximum capacity, in order to cancel the memory effect, the refresh processing is generally done, which completely discharges (SOC 0%) or completely charges (SOC 100%) the battery.

However, the maintenance of a refreshing operation for the prescribed amount of time to maintain the complete discharging (SOC 0%) or the complete charging (SOC 100%) causes evaluation to require a long time, this being difficult as a practical matter in using batteries. The third embodiment, in order to estimate the SOC or the maximum capacity in a short period of time without maintaining the full charge (SOC 100%) or the full discharge (SOC 0%) for a prescribed amount of time, determines whether or not the partial derivative characteristic curve, which is actually measured data, has been influenced by the memory effect, or performs discharge processing for refreshing over as short as possible a period of time.

Figure 16:
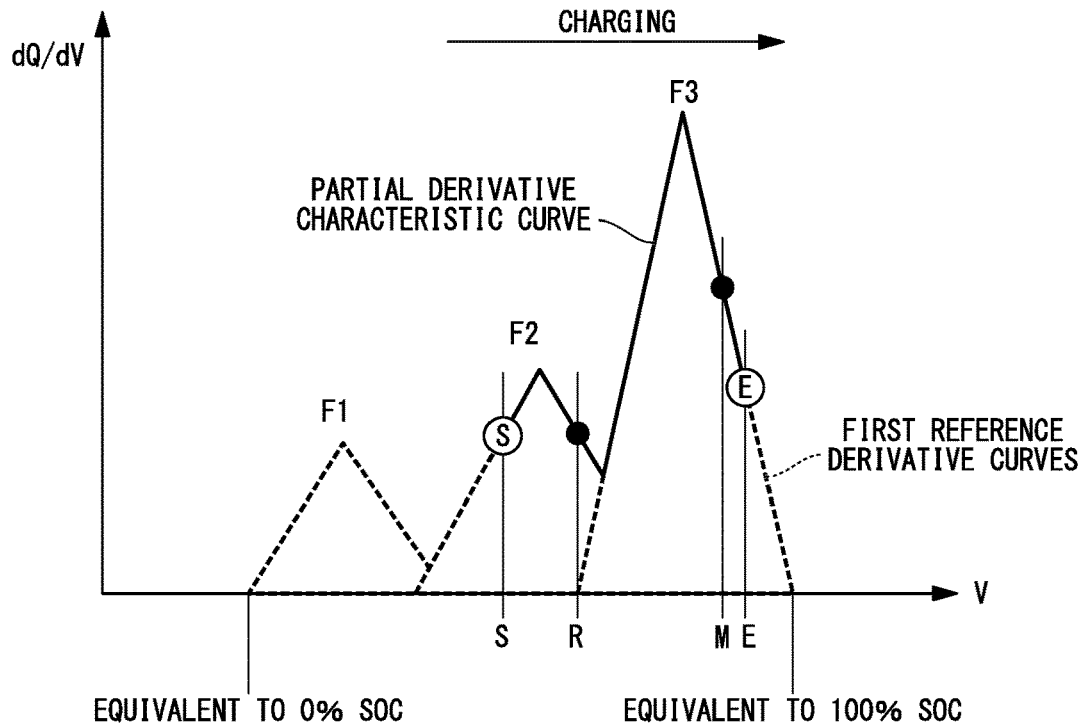
FIG. 16 is a drawing describing a refresh of the memory effect in a partial derivative characteristic curve corresponding to the first reference derivative curves obtained by synthesizing separated waveform derivative curves of a positive electrode and a negative electrode.

FIG. 16 describes the refreshing of the memory effect in the partial derivative characteristic curve corresponding to the first reference derivative curves obtained by synthesizing separated waveform derivative curves of the positive electrode and the negative electrode. In FIG. 16, the broken line indicates the first reference derivative curve and the solid line overlapping with the broken line (solid line between the voltage S and the voltage E) indicates the partial derivative characteristic curve. In FIG. 16, the vertical axis represents the strength (dQ/dV) and the horizontal axis represents the voltage, this showing the refreshing of the memory effect at the time of charging. In FIG. 16, for example, the positive electrode separated waveform derivative curve is approximated, for example by the function F1, and the negative electrode separated waveform derivative curve is approximated by the synthesis of the functions F2 and F3. Therefore, because the positive electrode separated waveform derivative curve and the negative electrode separated waveform derivative curve are synthesized, the first reference derivative curve is constituted by the synthesis of the curves of each of the functions F1, F2, and F3.

In the embodiments of the present invention, with the pre-condition that there is a phase transition corresponding to each peak, the phase transition of the active substance within the battery occurs at a voltage point at which the skirts (at both ends) of the first reference derivative curve crosses zero on the horizontal axis (the voltage at which the strength dQ/dV is zero), that is, if the horizontal axis zero-crossing voltage is the voltage R for the curve of each function, the refreshing of the memory effect when a phase transition occurs between peaks is used.

FIG. 16 shows the conditions for performing refreshing of the memory effect in the partial derivative characteristic curve when charging. In the partial derivative characteristic curve, the voltage S is the voltage at the start of the current charging cycle, the voltage E is the voltage at the stopping of the current charging cycle, the voltage R (SOC threshold) is the voltage at which the memory effect is refreshed, and the voltage M is the voltage at which the previous charging cycle was stopped and the discharging was started.

That is, if the voltage E at the stopping of the current charging cycle exceeds the voltage M at the stopping of charging at the immediately previous cycle, in the voltage region which passes through the voltage M, an abnormal variation occurs of the strength (dQ/dV) in the partial derivative characteristic curve. However, by making the voltage at the start of the charging lower than the refreshed voltage R, the memory effect at the voltage M is refreshed. By the memory voltage M existing at a peak corresponding to the function F3, at a voltage that is lower than the voltage at which the voltage R at which the curve of the function F3 crosses zero, charging starts from within the peak corresponding to the different function F2, the memory effect in the partial derivative characteristic curve at the time of charging is refreshed, passing through the voltage R at which a phase transition of the active substance occurs during discharging.

Figure 17:
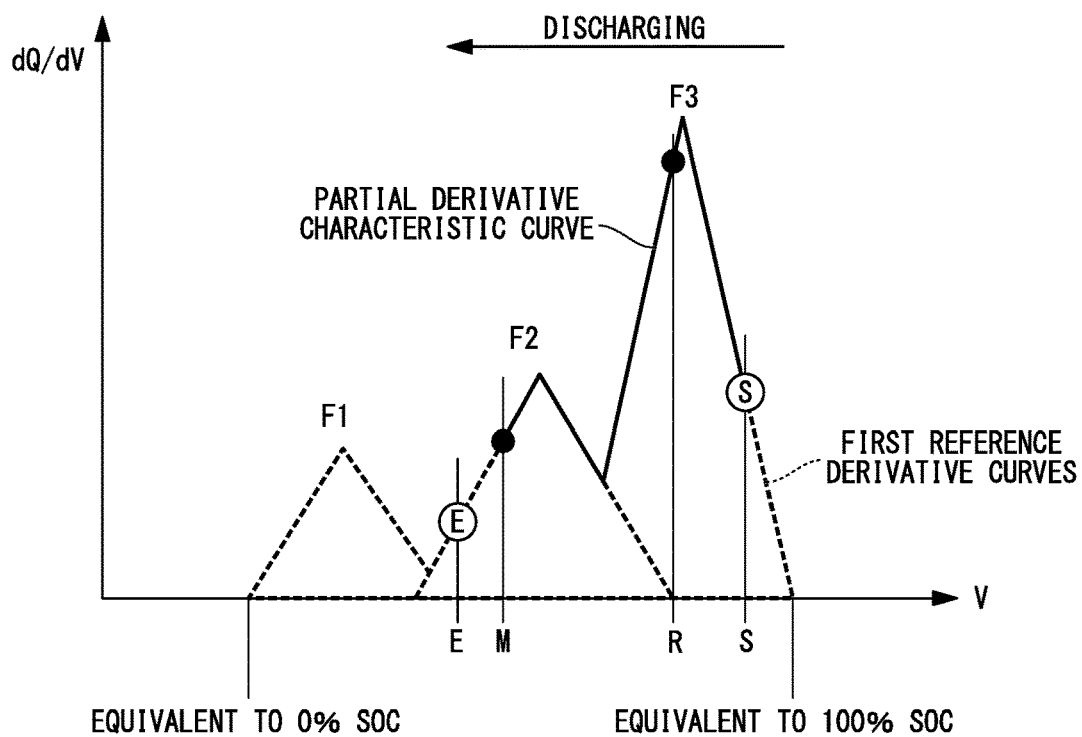
FIG. 17 is a drawing describing a refresh of the memory effect in a partial derivative characteristic curve corresponding to the first reference derivative curves obtained by synthesizing separated waveform derivative curves of a positive electrode and a negative electrode.

FIG. 17 describes a refresh of the memory effect in a partial derivative characteristic curve corresponding to the first reference derivative curve obtained by synthesizing separated waveform derivative curves of positive electrode and a negative electrode. In FIG. 17, the broken line indicates the first reference derivative curve and the solid line overlapping with the broken line (solid line between the voltage S and the voltage E) indicates the partial derivative characteristic curve. In FIG. 17, the vertical axis represents the strength (dQ/dV) and the horizontal axis represents the voltage, this showing the refreshing of the memory effect at the time of discharging. In FIG. 17, for example, similar to FIG. 16, the positive electrode separated waveform derivative curve is approximated, for example by the function F1, and the negative electrode separated waveform derivative curve is approximated by the synthesis of the functions F2 and F3. Therefore, because the positive electrode separated waveform derivative curve and the negative electrode separated waveform derivative curve are synthesized, the first reference derivative curve is constituted by the synthesis of the curves of each of the functions F1, F2, and F3.

In the embodiments of the present invention, as already described, the phase transition of the active substance within the battery occurs at a voltage point at which the skirts (at both ends) of the first reference derivative curve crosses zero on the horizontal axis (the voltage at which the strength dQ/dV is zero), that is, at the horizontal axis zero-crossing voltage for the curve of each function, the refreshing of the memory effect when a phase transition occurs is used.

FIG. 17 shows the conditions for performing refreshing of the memory effect in the partial derivative characteristic curve when discharging. The voltage S is the voltage at the start of the current discharging cycle, the voltage E is the voltage at the stopping of the current discharging cycle, the voltage R is the voltage at which the memory effect is refreshed, and the voltage M is the voltage at which the previous discharging cycle is stopped and the charging is started.

That is, if the voltage E at the stopping of the current discharging cycle is lower than the voltage M at the stopping of discharging at the immediately previous cycle, in the voltage region that passes through the voltage M, an abnormal variation occurs of the strength (dQ/dV) in the partial derivative characteristic curve. However, by making the voltage at the start of the discharging equal to or higher than the refreshed voltage R, the memory effect at the voltage M is refreshed. By the memory voltage M existing at a peak corresponding to the function F2, at a voltage that is lower than the voltage at which the voltage R at which the curve of the function F2 crosses zero, discharging starts from within a peak corresponding to a different function F3, the memory effect in the partial derivative characteristic curve at the time of discharging is refreshed, passing through the voltage R at which a phase transition of the active substance occurs during discharging.

In FIG. 16 and FIG. 17, the voltage R at which refreshing is done, as already described, is set to a voltage where each of the functions (for example, the functions F1, F2, and F3) forming the first reference derivative curve, that is, the curves of each of the functions corresponding to peaks in the first reference derivative curve, crosses zero on the horizontal axis (voltage axis) (the voltage at which the strength dQ/dV is zero). This voltage R is determined by calculations at both the left and right of the curve.

In the case in which the skirts of the curves of a function are long and the voltage value of zero crossing broadens greatly, so as to include a peak of a curve of another function, the voltage at which a tangent line having the greatest slope among the tangent lines to the curves crosses the horizontal axis may be set as the voltage R. A value, such as a voltage value that is 5% of the peak value at which the refresh effect is observed by performing an experiment beforehand for the peak value at the peak of the strength (dQ/dV) may be set as the voltage R.

Figure 18:
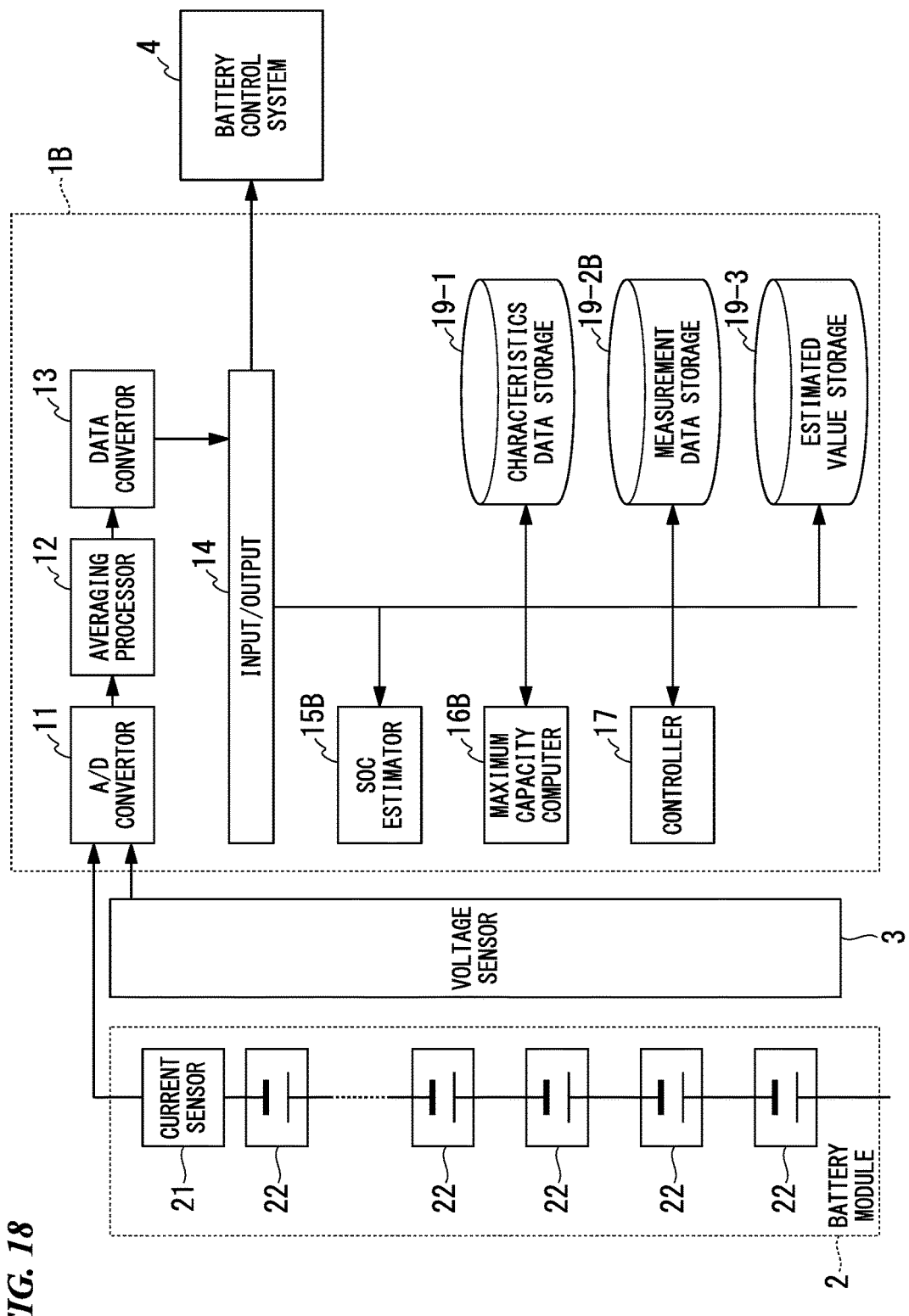
FIG. 18 is a drawing showing an example of the constitution of a secondary battery capacity measurement system according to a third embodiment of the present invention.

Next, an example of the constitution of a second battery capacity measurement system 1B in the third embodiment will be described. FIG. 18 (18) shows an example of the constitution of a secondary battery capacity measurement system in according with the third embodiment of the present invention. The third embodiment has, in place of the SOC computer 15, the maximum capacity computer 16, and the measurement data storage 19-2 of the first embodiment, the SOC computer 15B, the maximum capacity computation unit 16B, and the measurement data storage 19-2B, respectively. In the following the constituent elements and operation of the third embodiment that differ from the first embodiment will be described.

The measurement data storage 19-2B stores, separate from the memory area of the ring buffer constitution in the first embodiment, the voltage M at which the charging was stopped in the immediately previous charging cycle (hereinafter, the voltage MC), the voltage M at which the immediately previous discharging was stopped (hereinafter, the voltage MD), which are written thereinto by the controller 17. In the embodiments of the present invention, the controller 17, in the immediately previous charging cycle and discharging cycle, writes and stores the voltage E at which the charging was stopped in the charging cycle as the voltage MC into the measurement data storage 19-2B and writes and stores the voltage E at which the discharging was stopped in the discharging cycle as the voltage MD into the measurement data storage 19-2B.

Figure 19:
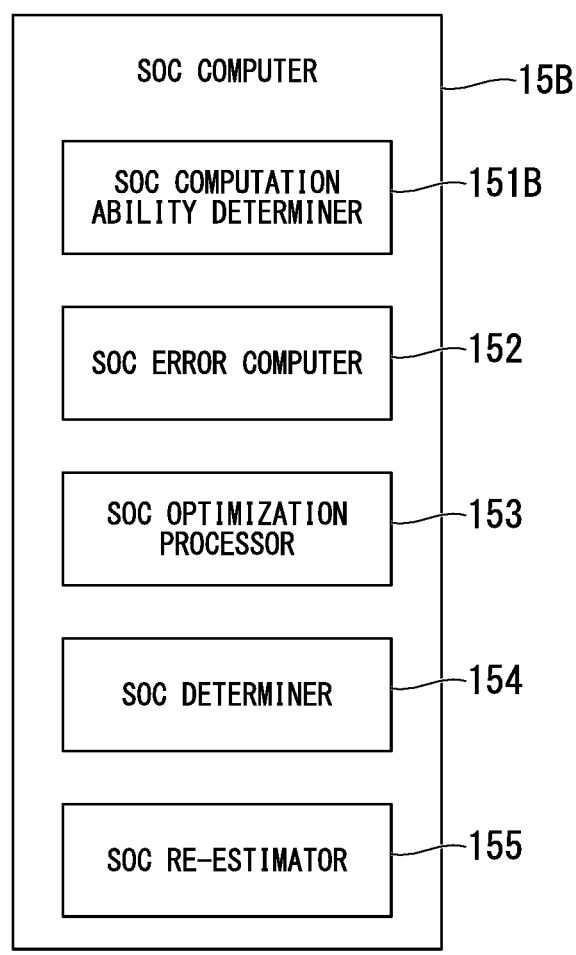
FIG. 19 is a drawing showing an example of the constitution of an SOC computer 15B shown in FIG. 18 in the third embodiment.

FIG. 19 shows an example of the constitution of the SOC computer 15B of FIG. 18 in the third embodiment. In FIG. 19, the SOC computer 15B has the SOC computation ability determiner 151B, the SOC error computer 152, the SOC optimization processor 153, the SOC determiner 154, and the SOC re-estimator 155.

In this case, the SOC error computer 152, the SOC optimization processor 153, the SOC determiner 154, and the SOC re-estimator 155 are each constituted in the same manner as the SOC error computer 152, the SOC optimization processor 153, the SOC determiner 154, and the SOC re-estimator 155 of the SOC computer 15 of the first embodiment.

The SOC computation ability determiner 151B, in addition to the operation of the SOC computation ability determiner 151 in the SOC computer 15 of the first embodiment, performs the following processing when the SOC is estimated. When the SOC is estimated using charging data, which is the partial derivative characteristic curve when charging (a data set of measurement data in the current charging cycle stored in the measurement data storage 19-2B) the SOC computation ability determiner 151B reads out the immediately previous voltage MC from the measurement data storage 19-2B. Then, the SOC computation ability determiner 151B compares the voltage E at which the charging was stopped in the current charging cycle with the voltage MC read out from the measurement data storage 19-2B.

When this is done, if the SOC computation ability determiner 151B determines that the voltage E is equal to or greater than the voltage MC (the voltage MC is included in the partial derivative characteristic curve), because the influence of the memory effect occurs when passing through the voltage M, a judgment is made regarding whether or not the refreshing is performed with respect to the memory effect. That is, the SOC computation ability determiner 151B determines whether or not the voltage S at which the current charging cycle was started is below the voltage R at which the refreshing is performed (which may include judgment of whether the voltage R is included in the partial derivative characteristic curve). Then, if the SOC computation ability determiner 151B determines that the voltage S is lower than the voltage R (including the judgment that the voltage R is included in the partial derivative characteristic curve), the memory effect being taken to be refreshed the judgment is made that the charging data in the current charging cycle can be used in the estimation of the SOC. If, however the SOC computation ability determiner 151B determines that the voltage S is equal to or greater than the voltage R, the memory effect being taken not to be refreshed the judgment is made that the charging data in the current charging cycle cannot be used in the estimation of the SOC.

Figure 20:
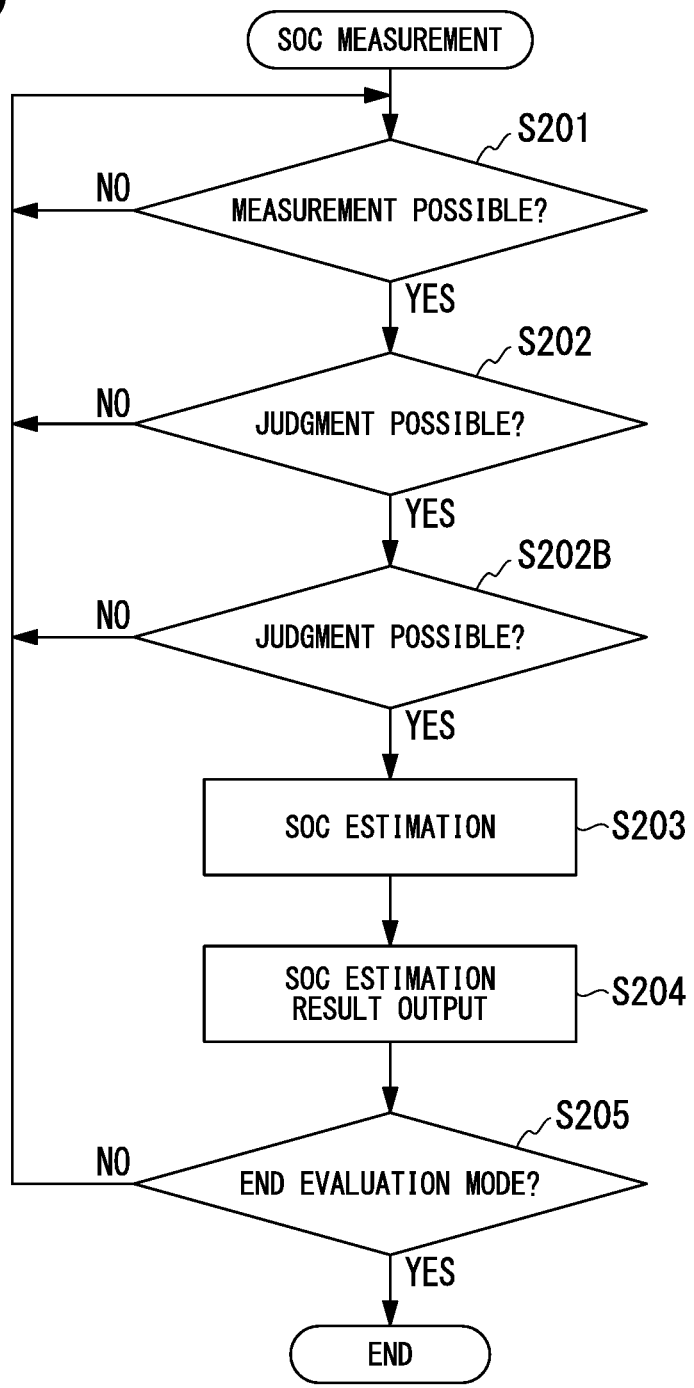
FIG. 20 is a flowchart showing an example of the operation in processing to estimate the SOC using the first partial derivative characteristic curve and the second partial derivative characteristic curve in the third embodiment.

FIG. 20 is a flowchart showing an example of the operation of processing to estimate the SOC using the first partial derivative characteristic curve and the second partial derivative characteristic curve in the third embodiment.

In FIG. 20, each of step S201, step S203, step S204, and step S205 are the same as step S201, step S203, step S204, and step S205 in FIG. 10.

In the flowchart of FIG. 20, step S202B is interposed between step S202 and step 203 of the flowchart of FIG. 10. In the following, the operation of only step S202B will be described.

At step S202B, if the SOC computation ability determiner 151B determines that the partial derivative characteristic curve, which is charging data, is used in the estimation of the SOC, it reads out the voltage MC from the measurement data storage 19-2B and determines whether the voltage E is equal to or greater than the voltage MC.

If the SOC computation ability determiner 151B determines that the voltage E is equal to or greater than the voltage MC (including that the voltage MC is included in the partial derivative characteristic curve), because the influence of the memory effect occurs when passing through the voltage MC, it determines whether or not refreshing is performed with respect to the memory effect. That is, the SOC computation ability determiner 151B determines whether or not the voltage S at which the current charging cycle was started is less than the voltage R at which refreshing is done.

If the SOC computation ability determiner 151B determines that the voltage E is below the voltage MC or whether or not the voltage S is below the voltage R (including the voltage R being included in the partial derivative characteristic curve), processing proceeds to step S203. If, however, the SOC computation ability determiner 151B determines that the voltage E is equal to or greater than the voltage MC and also the voltage S is equal to or greater than the voltage R, the computation of the SOC being not possible by the partial derivative characteristic curve at the time of charging, processing proceeds to step S201.

At step S202B, if the SOC computation ability determiner 151B determines that the partial derivative characteristic curve, which is discharging data, is to be used in the SOC estimation, it reads out the voltage MD from the measurement data storage 19-2B and determines whether or not the voltage E is lower than the voltage MD (which may include judgment of whether or not the voltage R is included in the partial derivative characteristic curve).

If the SOC computation ability determiner 151B determines that the voltage E is below the voltage MD, because the influence of the memory effect will occur when passing through the voltage MD, it determines whether or not the refreshing of the memory effect is performed. That is, the SOC computation ability determiner 151B determines whether or not the voltage S at which the current charging cycle was started exceeds the voltage R at which refreshing is done (including judgment that the voltage R is included in the partial derivative characteristic curve).

Then, if the SOC computation ability determiner 151B determines that the voltage E exceeds the voltage MD or that the voltage S exceeds the voltage R (including judgment that the voltage R is included in the partial derivative characteristic curve), the SOC computation being possible by the partial derivative characteristic curve at the time of discharging, processing proceeds to step S203. If, however, the SOC computation ability determiner 151B determines that the voltage E is equal to or lower than the voltage MD and also the voltage S is equal to or lower than the voltage R, the SOC computation not being possible by the partial derivative characteristic curve at the time of discharging, processing proceeds to step S201.

Figure 21:
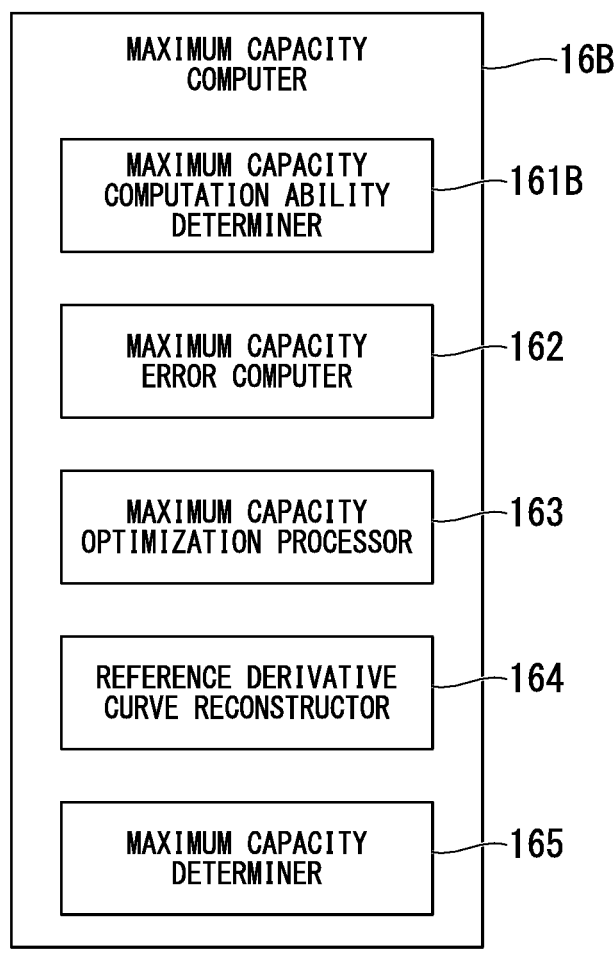
FIG. 21 is a drawing showing an example of the constitution of a maximum capacity computer 16B in FIG. 18 in the third embodiment.

FIG. 21 shows an example of the constitution of the maximum capacity computer 16B of FIG. 18 in the third embodiment. In FIG. 21, the maximum capacity computer 16B has the maximum capacity computation ability determiner 161B, the maximum capacity error computer 162, the maximum capacity optimization processor 163, the reference derivative curve reconstructor 164, and the maximum capacity determiner 165.

In this case, the maximum capacity error computer 162, the maximum capacity optimization processor 163, the reference derivative curve reconstructor 164, and the maximum capacity determiner 165 have the same constitutions as the maximum capacity error computer 162, the maximum capacity optimization processor 163, the reference derivative curve reconstructor 164, and the maximum capacity determiner 165 in the maximum capacity computer 16 of the first embodiment.

The maximum capacity computation ability determiner 161B, in addition to the operation of the maximum capacity computation ability determiner 161 in the maximum capacity computer 16 of the first embodiment, performs the following processing when the maximum capacity is estimated. The maximum capacity computation ability determiner 161B reads out the immediately previous voltage MC form the measurement data storage 19-2B when the maximum capacity is estimated using the charging data, which is the partial derivative characteristic curve (a data set of measurement data in the current charging cycle stored in the measurement data storage 19-2B). Then, the maximum capacity computation ability determiner 161B compares the voltage E at which the charging was stopped in the current charging cycle with the voltage MC read out from the measurement data storage 19-2B.

When this is done, if the maximum capacity computation ability determiner 161B determines that the voltage E is equal to or greater than the voltage MC, because the influence of the memory effect occurs when passing through the voltage M, it determines whether or not refreshing is done of the memory effect. That is, the maximum capacity computation ability determiner 161B determines whether or not the voltage S at which the current charging cycle started is lower than the voltage R at which the refreshing is done. Then, if the maximum capacity computation ability determiner 161B determines that the voltage S is less than the voltage R, with refreshing of the memory effect being done, the judgment is made that the charging data in the current charging cycle can be used in the estimation of the maximum capacity. If, however, the maximum capacity computation ability determiner 161B determines that the voltage S is equal to or greater than the voltage R, with the refresh of the memory effect not being done, the judgment is made that the charging data in the current charging cycle cannot be used to estimate the maximum capacity.

Figure 22:
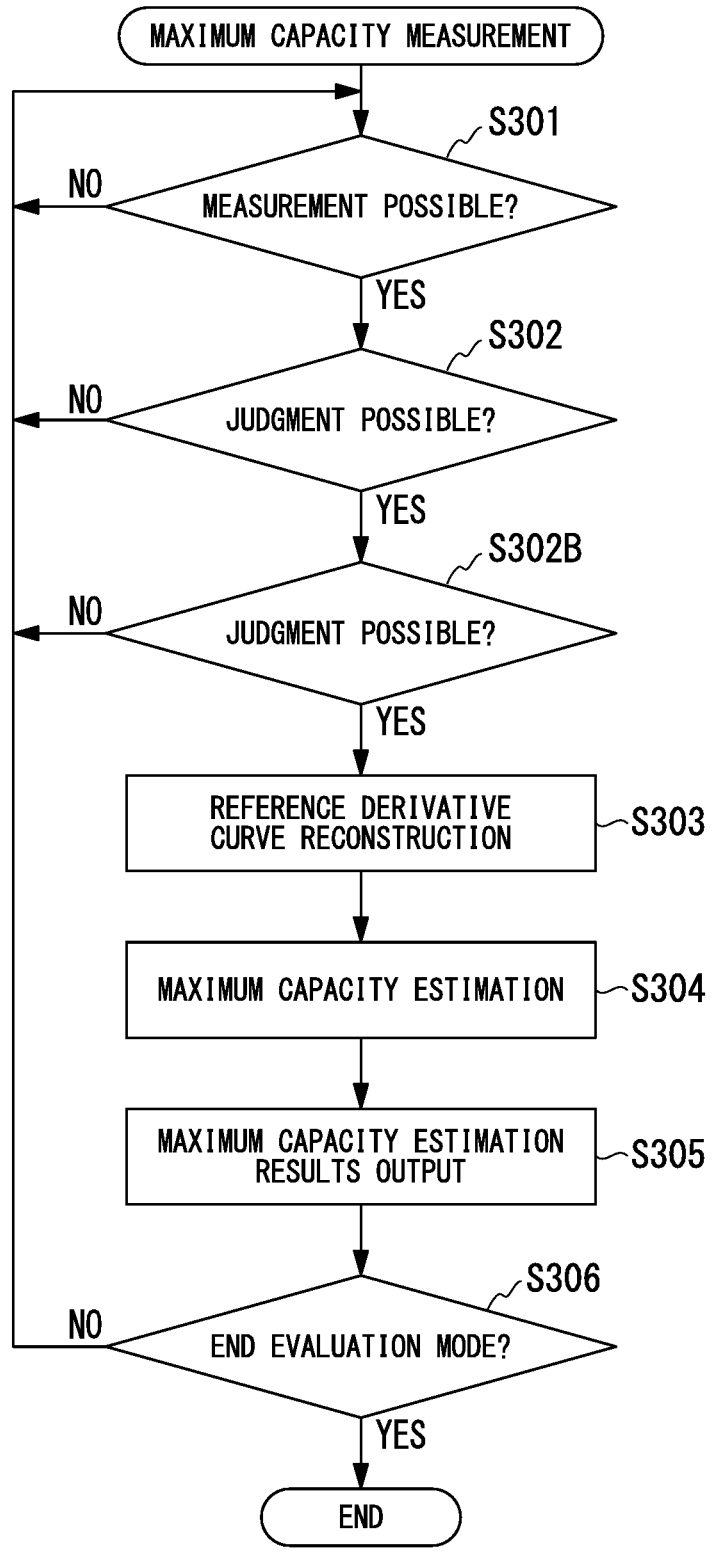
FIG. 22 is a flowchart showing an example of the operation in processing to estimate the maximum capacity using the first partial derivative characteristic curve and the second partial derivative characteristic curve in the third embodiment.
Figure 23:
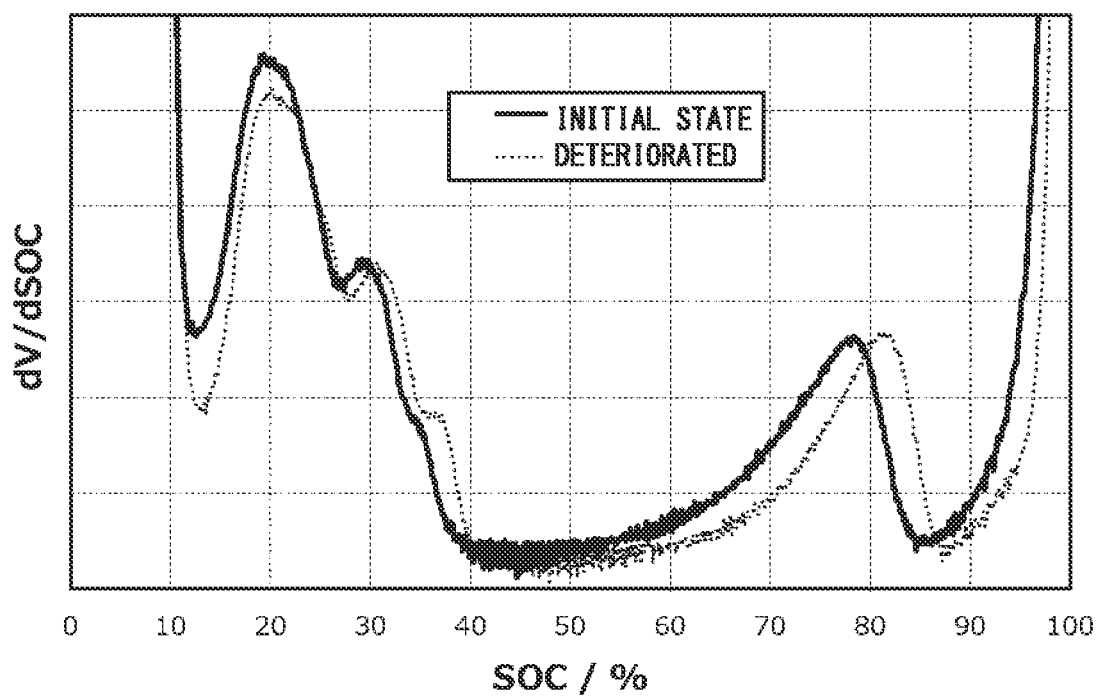
FIG. 23 is a drawing showing curves of the relationship of correspondence between dV/dSOC and the SOC.

FIG. 22 is a flowchart showing an example of the operation of processing to estimate the SOC using the first partial derivative characteristic curve and the second partial derivative characteristic curve in the third embodiment.

In FIG. 22, step S301, step S303, step S304, and step S305 are the same as step S301, step S303, step S304, and step S305 in FIG. 12.

In the flowchart of FIG. 22, step S302B is interposed between step S302 and step 303 of the flowchart of FIG. 12. In the following, the operation of only step S302B will be described.

At step S302B, if the maximum capacity computation ability determiner 161B determines that the partial derivative characteristic curve, which is charging data, is to be used in the maximum capacity estimation, it reads out the voltage MC from the measurement data storage 19-2B and determines whether or not the voltage E is equal to or greater than the voltage MC.

If the maximum capacity computation ability determiner 161B determines that the voltage E is equal to or greater than the voltage MC, because the influence of the memory effect will occur when passing through the voltage MC, it determines whether or not the refreshing of the memory effect is performed. That is, the maximum capacity computation ability determiner 161B determines whether or not the voltage S at which the current charging cycle was started is lower than the voltage R at which refreshing is performed.

Then, if the maximum capacity computation ability determiner 161B determines that the voltage E is lower than the voltage MC or that the voltage S is lower than the voltage R, the maximum capacity computation being possible by the partial derivative characteristic curve at the time of charging, processing proceeds to step S303. If, however, the maximum capacity computation ability determiner 161B determines that the voltage E is equal to or greater than the voltage MC and also the voltage S is equal to or greater than the voltage R, the maximum capacity computation being not possible by the partial derivative characteristic curve at the time of charging, processing proceeds to step S301.

At step S302B, if the maximum capacity computation ability determiner 161B determines that the partial derivative characteristic curve, which is discharging data, is to be used in the estimation of the maximum capacity, it reads out the voltage MD from the measurement data storage 19-2B and determines whether or not the voltage E is equal to or lower than the voltage MD.

Then, if the maximum capacity computation ability determiner 161B determines that the voltage E is equal to or lower than the voltage MD, because the influence of the memory effect occurs when passing through the voltage MD, a judgment is made of whether or not refreshing is done with respect to the memory effect. That is, the maximum capacity computation ability determiner 161B determines whether or not the voltage S at which the current charging cycle started exceeds the voltage R at which refreshing is done.

Then, if the maximum capacity computation ability determiner 161B determines that the voltage E exceeds the voltage MD or the voltage S exceeds the voltage R, the maximum capacity computation by the partial derivative characteristic curve at the time of discharging being possible, processing proceeds to step S303. If, however, the maximum capacity computation ability determiner 161B determines that the voltage E is equal to or lower than the voltage MD and also the voltage S is equal to or lower than the voltage R, the maximum capacity computation by the partial derivative characteristic curve at the time of discharging not being possible, processing proceeds to step S301.

According to the above-described embodiments of the present invention, when estimating the SOC and the maximum capacity, because a judgment is made regarding whether or not measurement data (partial derivative characteristic curve) used in the estimation includes the influence of the memory effect, and only measurement data that does not include the influence of the memory effect is used to estimate the SOC and the maximum capacity, it is possible to prevent an increase in the SOC estimation error and the maximum capacity estimation error due to the memory effect, thereby enabling estimation of the SOC and the maximum capacity with a high accuracy and stable battery operation. In the embodiments of the present invention, the judgment of whether or not the partial derivative characteristic curve includes the influence of the memory effect is made by whether or not the voltage M is included within the partial derivative characteristic curve from the voltage S and the voltage E and, in the case in which the voltage M is included within the partial derivative characteristic curve, whether the voltage R is included within the partial derivative characteristic curve and also the voltage S in the charging cycle or discharging cycle exists before the voltage R in the direction of change of the voltage in charging and discharging.

According to the embodiments of the present invention, estimation of the SOC and the maximum capacity is possible in a short period of time, without performing a refresh operation that maintains the fully discharged condition (SOC 0%) or the fully charged condition (SOC 100%) for a prescribed amount of time and also without requiring a long period of time to estimate the SOC and the maximum capacity.

Although each of the above-described SOC computer 15B and the maximum capacity computer 16B were described as replacing the SOC computer 15 and the maximum capacity computer 16 in the first embodiment, respectively, each of the second SOC computer 15 and the maximum capacity computer 16 may be replaced.

A constitution may be adopted in which the above-noted function of judging whether or not the processing to refresh the memory effect is done is provided in the controllers 17 of the first embodiment and the second embodiment, and made to control so that, in the charging cycle the voltage M at which the influence of the memory effect occurs is not included between the charging starting voltage S and the charging ending voltage E, and so that, in the discharging cycle, the voltage M at which the influence of the memory effect occurs is not included between the discharging starting voltage S and the discharging ending voltage E.

A program for implementing the functionality of the secondary battery capacity measurement system 1 of FIG. 3, the secondary battery capacity measurement system 1A of FIG. 14, and the secondary battery capacity measurement system 1B of FIG. 18 of the present invention may be stored in a computer-readable recording medium, a computer system being made to read in and execute the program stored in the recording medium, so as to perform the processing of the secondary battery capacity measurement system. The term "computer system" includes an operating system and hardware such as peripheral devices. The term "computer system" may include a WWW system having an environment for providing a website (or a display environment). The term "computer-readable recording medium" refers to a removable medium such as a flexible disk, an optomagnetic disk, a ROM, a CD-ROM, or the like, or a storage device such as a hard disk or the like built into a computer system. Additionally, the "computer-readable recording medium" encompasses one holding a program for a given period of time, such as a volatile memory (RAM) within a computer system serving as a server or client in the case in which a program is transmitted via a network.

The above-noted program may be transferred from a computer system in which the program is stored in a recording device or the like, via a transfer medium or by transfer to another computer by a transfer wave in a transfer medium. In this case, the "transfer medium" transferring the program is a medium having the function of transferring information, such as a network (communication network) such as the Internet or a communication circuit (communication line) such as a telephone circuit. The above-noted program may be for implementing a part of the above-described functionality. Additionally, it may be a so-called difference file (difference program) enabling implementation by combination with a program that already has recorded therein the above-noted functionality in a computer system.

What is claimed is:

1. A system comprising at least one memory configured to store computer program code and at least one processor configured to access the at least one memory and operate according to the computer program code, the computer program code including:

a data convertor code configured to cause at least one of the at least one processor to determine a partial derivative characteristic curve of a capacity-to-voltage derivative over voltage from actually measured values of voltage and current in a partial region of a normal operating region of a secondary battery;

State of Charge (SOC) estimation code configured to cause at least one of the at least one processor to compute a difference between the partial derivative characteristic curve and a reference derivative curve that is derived from a positive material of a positive electrode of the secondary battery and a negative material of a negative electrode of the secondary battery and that indicates a reference characteristic of the capacity-to-voltage derivative, and configured to fit the partial derivative characteristic curve to the reference derivative curve by reducing the difference to estimate an SOC of the secondary battery using a minimum of actually measured data; and maximum capacity code configured to cause at least one of the at least one processor to estimate a maximum value of capacity of the secondary battery that is deteriorated, from the partial derivative characteristic curve and the reference derivative curve.

2. The system according to claim 1,
wherein the reference derivative curve is given by a separating curve complex of a first characteristic derivative curve that is derived from the positive material of the positive electrode of the secondary battery and a second characteristic derivative curve that is derived from the negative material of the negative electrode of the secondary battery.

3. The system according to claim 2,
wherein the first and second characteristic derivative curves are approximated with first and second functions which include first and second characteristic parameters of phase transition of the positive material and the negative material, respectively; and
the curves of the first and second functions are adjustable by the first and second characteristic parameters, respectively.

4. The system according to claim 1;
wherein each of the partial derivative characteristic curve and the reference derivative curve is a pair of first and second curves,
the first curve representing a first relationship of correspondence between the voltage V in the battery and a value dQ/dV obtained by differentiating the capacity Q by taking a change d/dV in the voltage as a differential operator, and
the second curve representing a second relationship of correspondence between the capacity Q in the battery and a value dV/dQ obtained by differentiating the voltage value V by taking a change d/dQ in the capacity as a differential operator.

5. The system according to claim 1, wherein the computer program code further includes:
a reference derivative curve reconstruction code configured to cause at least one of the at least one processor to, when the maximum capacity computer corrects the reference derivative curve, perform fitting between the partial derivative characteristic curve and the reference derivative curve and correct the reference derivative curve by adjusting the characteristic derivative curves derived from the positive electrode and the negative electrode so as to correspond the fitted shape of the partial derivative characteristic curve, wherein the maximum capacity code is configured to cause at least one of the at least one processor to estimate the maximum capacity using the corrected reference derivative curve.

6. The system according to claim 4,
wherein the SOC computer code includes SOC computation ability determination code configured to cause at least one of the at least one processor to:
determine whether or not the maximum value of the value dQ/dV in the partial derivative characteristic curve of the first relationship of correspondence is less than a first threshold, and
in response to the maximum value being less than the first threshold, the SOC estimation code causes at least one of the at least one processor to estimate the SOC.

7. The system according to claim 6,
wherein, in response to the returning SOC corresponding to a returning point of the immediately previous charging/discharging being included in the partial derivative characteristic curve, the SOC computation ability determination code causes the at least one of the at least one processor to determine whether or not the SOC threshold, based on the peak of the reference derivative curve because of the phase transition of the electrode material of the battery, is included in the partial derivative characteristic curve, and
in response to the SOC threshold deing included in the partial derivative characteristic curve, the SOC estimation code causes at least one of the at least one processor to estimate the SOC.

8. The system according to claim 6,
wherein the SOC computation ability determination code causes the at least one of the at least one processor to determine whether or not difference between the maximum value and the minimum value of the value dV/dQ in the partial derivative characteristic curve of the second relationship of correspondence exceeds a second threshold, and
in response to the difference exceeding the second threshold, the SOC estimation code causes at least one of the at least one processor to estimate the SOC.

9. The system according claim 4,
wherein the maximum capacity code includes maximum capacity computation ability determination code configured to cause at least one of the at least one processor to:
determine whether or not the maximum value of the value dQ/dV in the partial derivative characteristic curve of the first relationship of correspondence exceeds the first threshold, and
in response to the maximum value exceeding the first threshold, the maximum capacity code causes at least one of the at least one processor to estimate the maximum capacity.

10. The system according to claim 9;
in response to the returning SOC corresponding to a returning point of the immediately previous charging/discharging being included in the partial derivative characteristic curve, the maximum capacity computation ability determination code configured to cause at least one of the at least one processor to:
determine whether or not the SOC threshold, based on the peak of the reference derivative curve because of the phase transition of the electrode material of the battery, is included in the partial derivative characteristic curve, and in response to the SOC threshold being included in the partial derivative characteristic curve, the maximum capacity code causes at least one of the at least one processor to estimate the maximum capacity.

11. The system according to claim 9,
wherein the maximum capacity computation ability determination code is configured to cause at least one of the at least one processor to:
determines whether or not difference between the maximum value and the minimum value of the value dV/dQ in the partial derivative characteristic curve of the second relationship of correspondence exceeds a third threshold, and
in response to the difference exceeding the third threshold, the maximum capacity code causes at least one of the at least one processor to estimate the maximum capacity.

12. The system according to claim 1, wherein the computer program code further includes:
averaging code configured to cause at least one of the at least one processor to perform piecewise or moving averaging processing in a prescribed time range with respect to the actually measured values of the secondary battery that is charged and discharge in a time sequence, so as to take the determined average value as time sequential data of the measured value.

13. The system according to claim 5, wherein
the SOC estimation code includes SOC error code configured to cause at least one of the at least one processor to:
compute the difference between the reference derivative curve and the partial derivative characteristic curve; and
using a reference derivative curve of the second relationship of correspondence, which has been corrected by the partial derivative characteristic curve of the second relationship of correspondence, compute the difference between the reference derivative curve and the partial derivative characteristic curve to optimize as the variable the capacity that has been integrated at the starting point of the partial derivative characteristic curve,
wherein the SOC estimation code is further configured to cause at least one of the at least one processor to re-estimate the SOC by the optimized capacity therein providing an SOC with high accuracy even when the secondary battery exhibits deterioration.

14. The system according to claim 5, wherein
the maximum capacity code includes maximum capacity error code configured to cause at least one of the at least one processor to:
compute the difference between the reference derivative curve and the partial derivative characteristic curve; and
optimize the difference is computed between the partial derivative characteristic curve of the first relationship of correspondence and reference derivative curve of the first relationship of correspondence, or between the partial derivative characteristic curve of the second relationship of correspondence and the reference derivative curve of the second relationship of correspondence and the partial derivative characteristic curve of the first relationship of correspondence,
the reference derivative curve reconstruction code is configured to cause at least one of the at least one processor to correct the reference derivative curve of the first relationship of correspondence by the optimized partial derivative characteristic curve of the first relationship of correspondence, and the maximum capacity code is configured to cause at least one of the at least one processor to, by integrating the reference derivative curve of the first relationship of correspondence that has been corrected by the partial derivative characteristic curve of the first relationship of correspondence within the range of the prescribed voltage value V, compute the maximum capacity of the second battery.

15. The system according to claim 14, wherein, if there is a plurality of peaks in the partial derivative characteristic curve of the first relationship of correspondence, when the difference is computed between the reference derivative curve and the partial derivative characteristic curve of the first relationship of correspondence, the maximum capacity error code is configured to cause at least one of the at least one processor to use the distances between the peak spacing as one of the parameters in computing errors, and the maximum capacity code is configured to cause at least one of the at least one processor to, by integrating the reference derivative curve of the first relationship of correspondence that has been corrected by the peak values of the partial derivative characteristic curve of the first relationship of correspondence within the range of the prescribed voltage value V, compute the maximum capacity of the second battery.

16. The system according to claim 1, wherein the SOC is estimated and the maximum value of capacity is estimated in parallel.

17. A method comprising:

determining a partial derivative characteristic curve of a capacity-to-voltage derivative over voltage from actually measured values of voltage and current in a partial region of a normal operating region of a secondary battery;

computing a difference between the partial derivative characteristic curve and a reference derivative curve that is derived from a positive material of a positive electrode of the secondary battery and a negative material of a negative electrode of the secondary battery and that indicates a reference characteristic of the capacity-to-voltage derivative;

fitting the partial derivative characteristic curve to the reference derivative curve by reducing the difference, to estimate an SOC of the secondary battery using a minimum amount of actually measured data; and estimating a maximum value of capacity of the secondary battery that is deteriorated, from the partial derivative characteristic curve and the reference derivative curve.

18. The second battery capacity measurement method according to claim 17, wherein the reference derivative curve is given by a separating curve complex of a first characteristic derivative curve that is derived from the positive material of the positive electrode of the secondary battery and a second characteristic derivative curve that is derived from the negative material of the negative electrode of the secondary battery.

19. The method according to claim 18, wherein the first and second characteristic derivative curves are approximated with first and second functions which include first and second characteristic parameters of phase transition of the positive material and the negative material, respectively; and the curves of the first and second functions are adjustable by the first and second characteristic parameters, respectively.

20. The method according to claim 17, wherein the SOC is estimated and the maximum value of capacity is estimated in parallel.

* * * * *